(12) United States Patent
Yamazaki

(10) Patent No.: US 10,129,531 B2
(45) Date of Patent: Nov. 13, 2018

(54) IMAGING APPARATUS AND IMAGE SENSOR ARRAY

(71) Applicant: Sony Corporation, Tokyo (JP)

(72) Inventor: Tomohiro Yamazaki, Kanagawa (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 308 days.

(21) Appl. No.: 15/015,427

(22) Filed: Feb. 4, 2016

(65) Prior Publication Data
US 2016/0173857 A1    Jun. 16, 2016

Related U.S. Application Data

(63) Continuation of application No. 13/771,865, filed on Feb. 20, 2013, now Pat. No. 9,294,756.

(30) Foreign Application Priority Data

Feb. 21, 2012  (JP) .................................. 2012-034974

(51) Int. Cl.
*H01L 27/146* (2006.01)
*H04N 9/45* (2006.01)
(Continued)

(52) U.S. Cl.
CPC .......... *H04N 13/239* (2018.05); *H04N 5/369* (2013.01); *H04N 5/3696* (2013.01);
(Continued)

(58) Field of Classification Search
CPC ............... H04L 27/00; H04L 27/14603; H04L 27/14609; H04N 13/0214
See application file for complete search history.

(56) References Cited

U.S. PATENT DOCUMENTS 7,567,271 B2 * 7/2009 Berestov ............ H04N 13/0214
                                                      348/272
2006/0027732 A1 * 2/2006 Ahn .................. H01L 27/14603
                                                      250/208.1
(Continued)

FOREIGN PATENT DOCUMENTS

| JP | HEI 06-054991 | 7/1994 |
| JP | 2004-309868 | 11/2004 |
| WO | WO/2006/039486 | 4/2006 |

*Primary Examiner* — Sathyanaraya V Perungavoor
*Assistant Examiner* — Patricia I Young
(74) *Attorney, Agent, or Firm* — Dentons US LLP

(57) ABSTRACT

An imaging apparatus including an imaging lens, and an image sensor array of first and second image sensor units, wherein a single first image sensor unit includes a single first microlens and a plurality of image sensors, a single second image sensor unit includes a single second microlens and a single image sensor, light passing through the imaging lens and reaching each first image sensor unit passes through the first microlens and forms an image on the image sensors constituting the first image sensor unit, light passing through the imaging lens and reaching each second image sensor unit passes through the second microlens and forms an image on the image sensor constituting the second image sensor unit, an inter-unit light shielding layer is formed between the image sensor units, and a light shielding layer is not formed between the image sensor units constituting the first image sensor unit.

15 Claims, 23 Drawing Sheets

(51) Int. Cl.
  *H04N 13/239* (2018.01)
  *H04N 13/218* (2018.01)
  *H04N 13/257* (2018.01)
  *H04N 5/369* (2011.01)
  *H04N 13/02* (2006.01)

(52) U.S. Cl.
  CPC ..... *H04N 13/0217* (2013.01); *H04N 13/0257* (2013.01); *H04N 13/218* (2018.05); *H04N 13/257* (2018.05)

(56) References Cited

U.S. PATENT DOCUMENTS

2010/0013042 A1   1/2010  Kim
2010/0091161 A1*  4/2010  Suzuki .............. H01L 27/14609
                                              348/302

\* cited by examiner

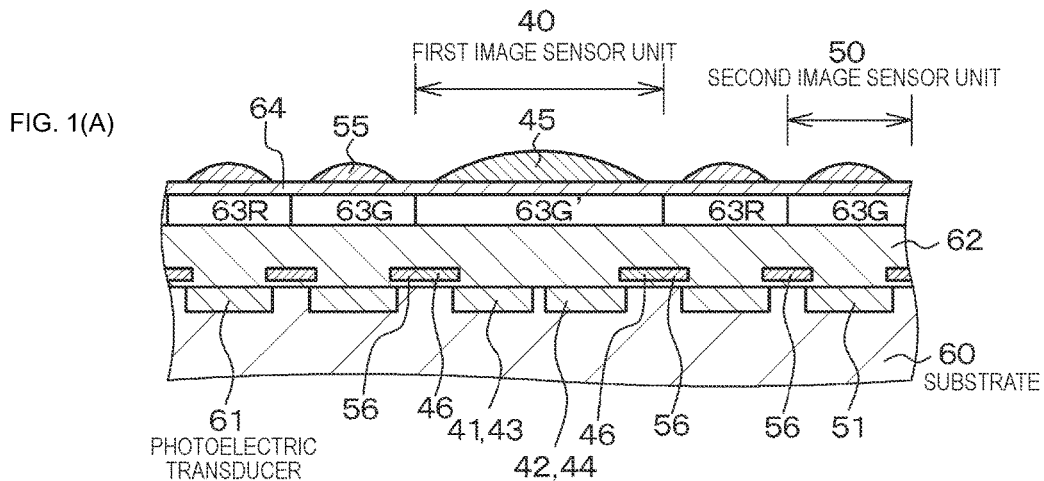
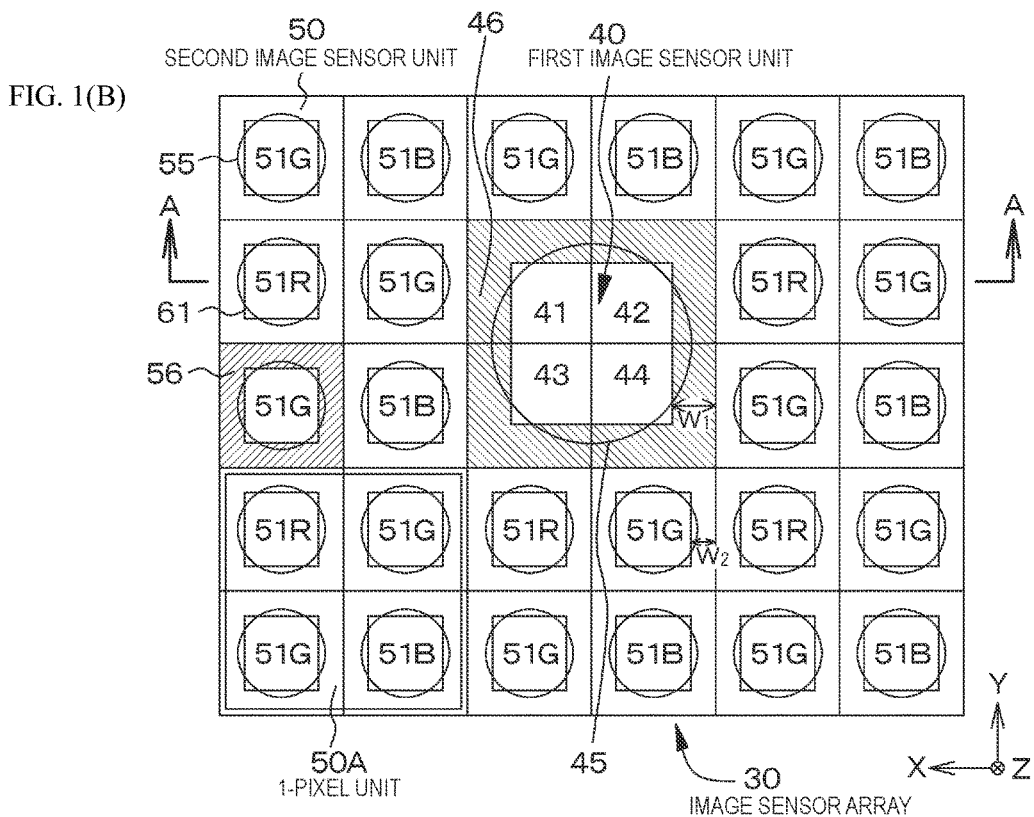

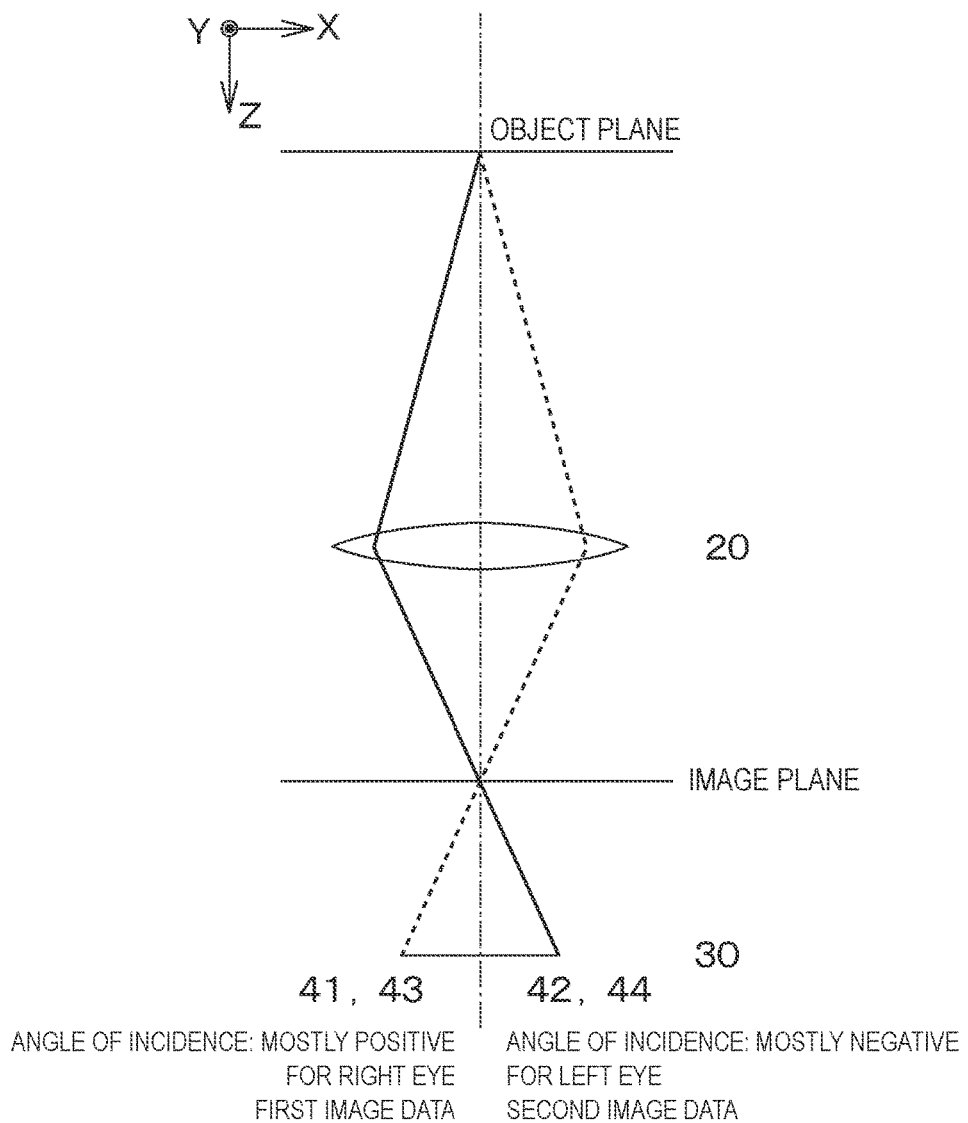

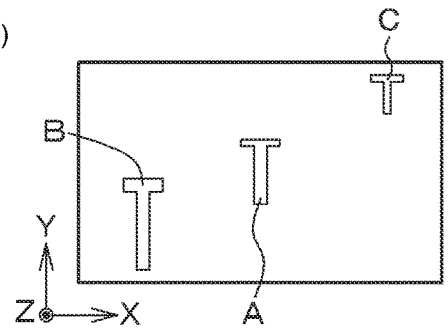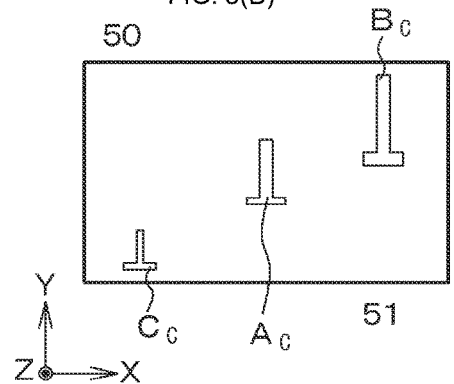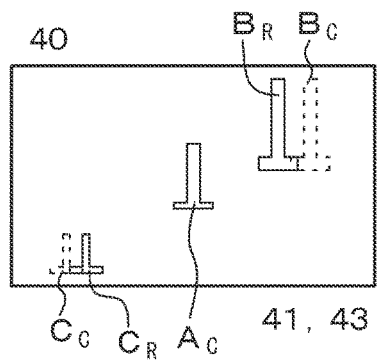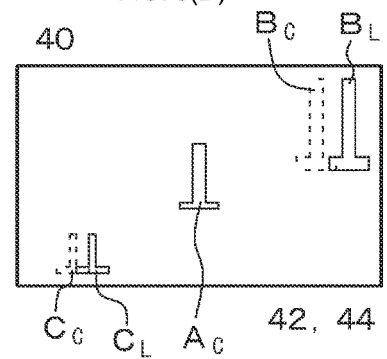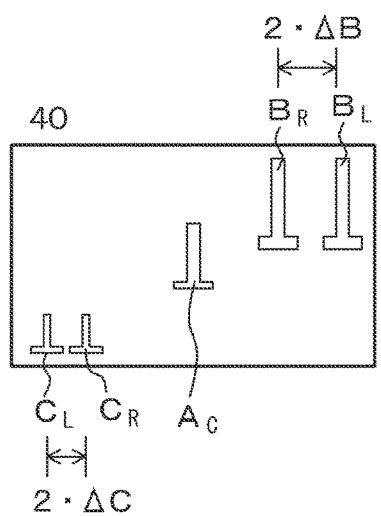

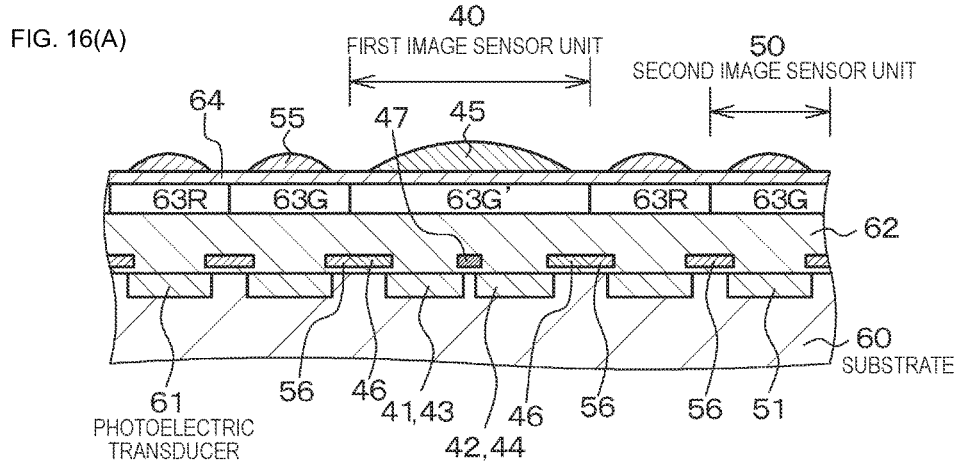
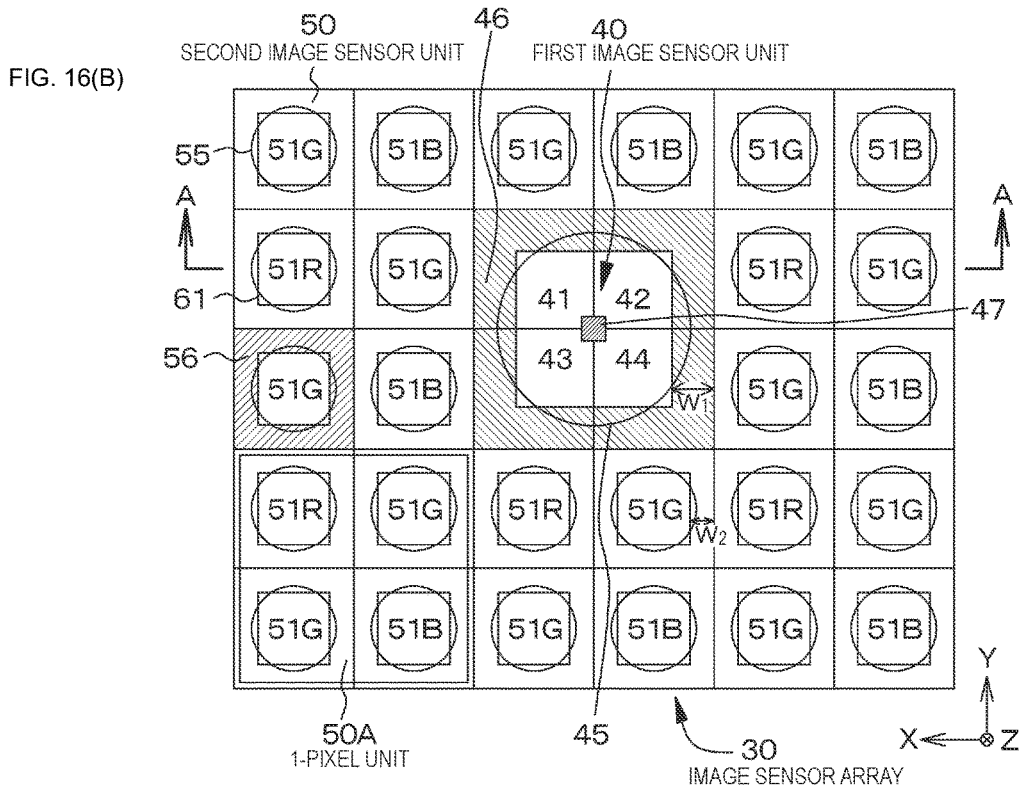

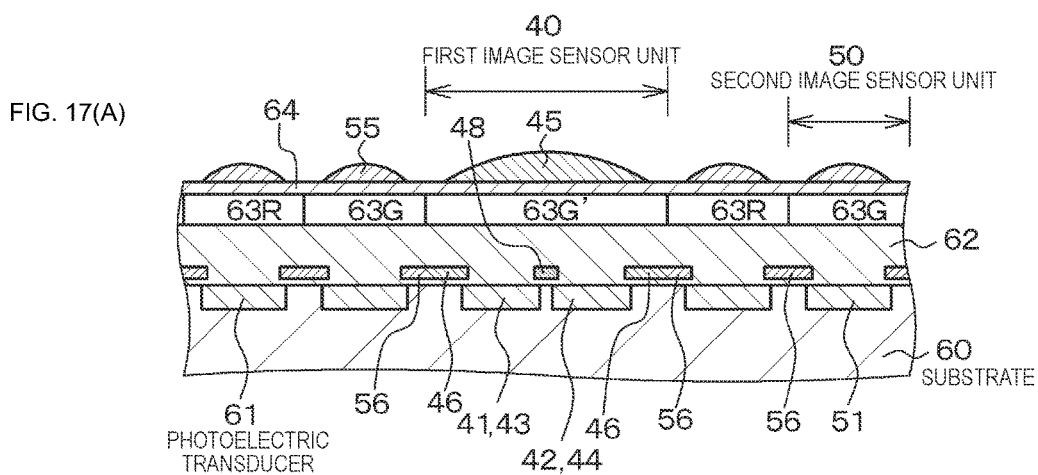
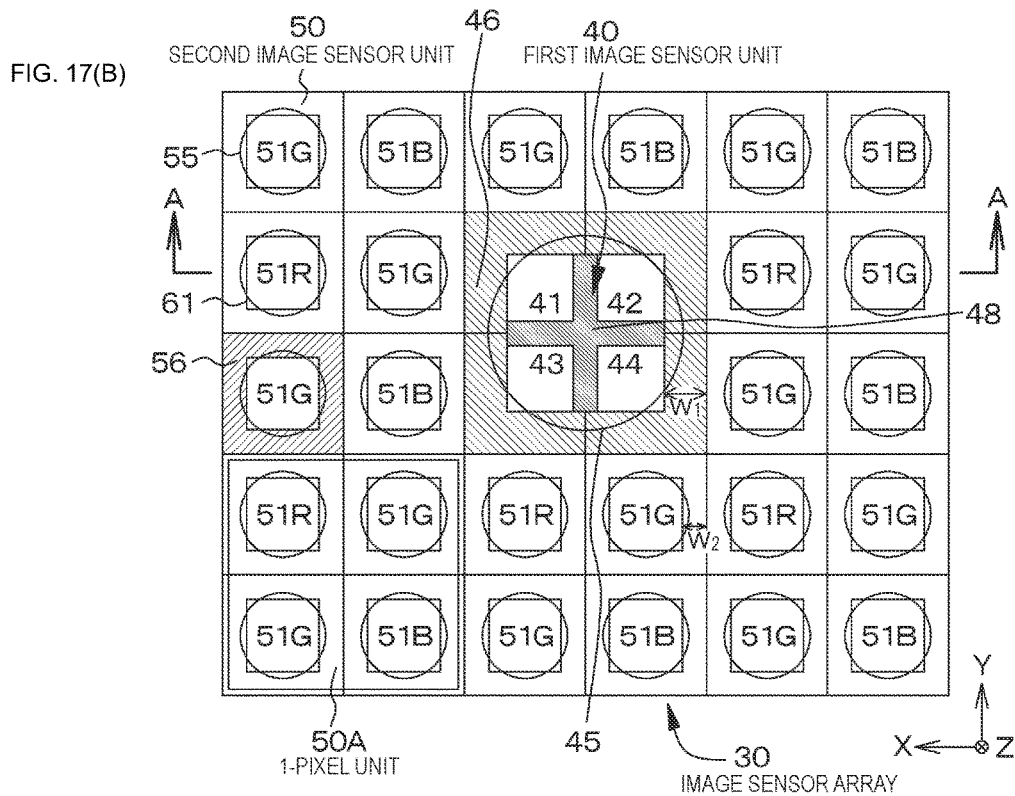

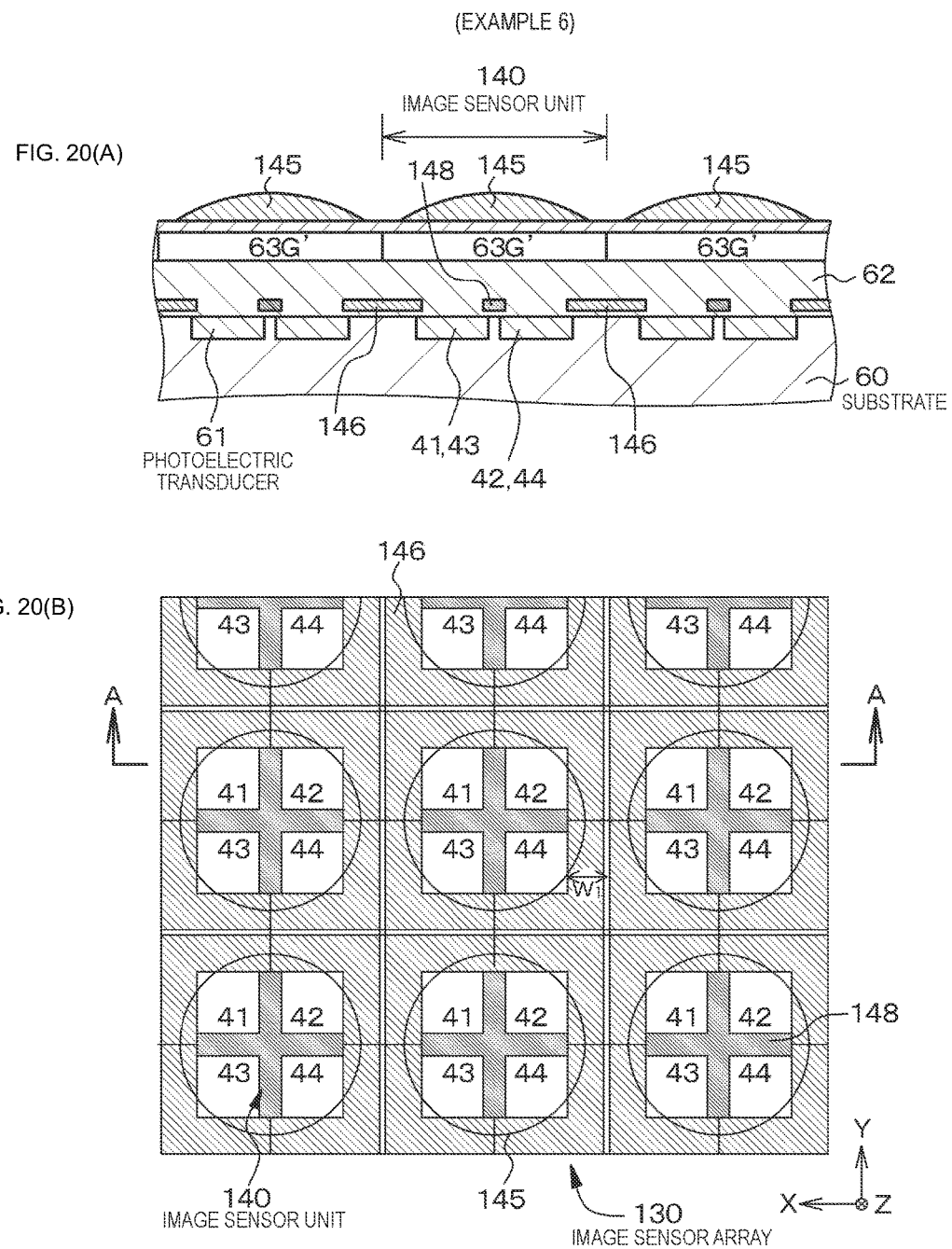

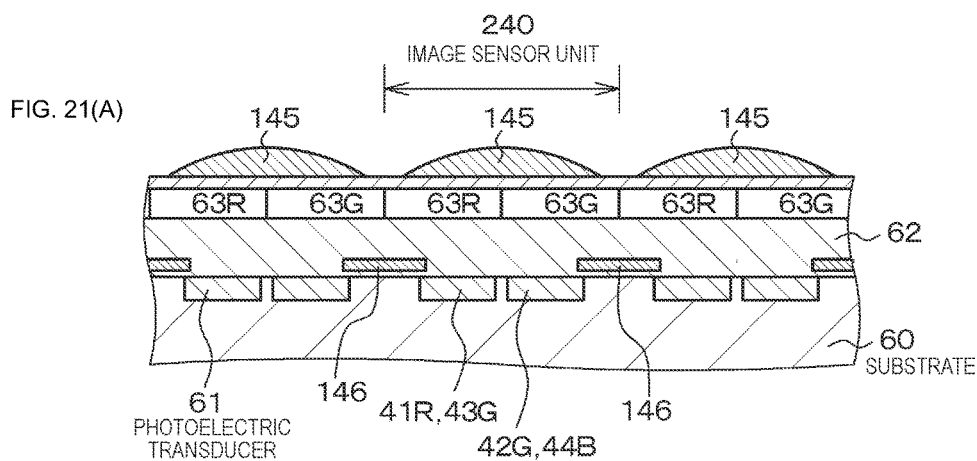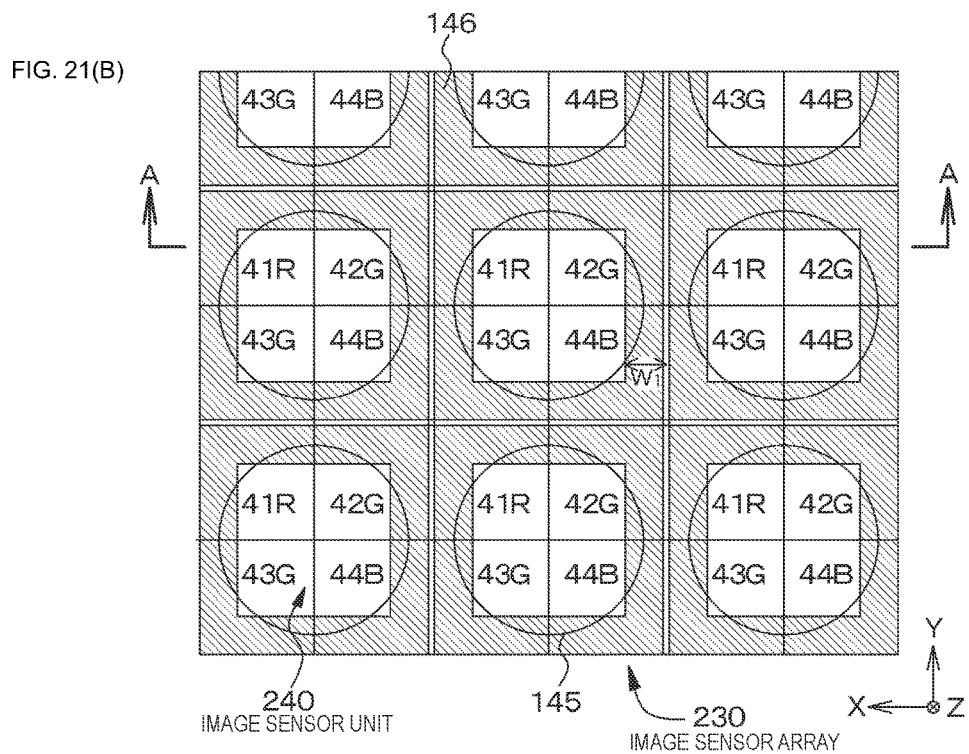

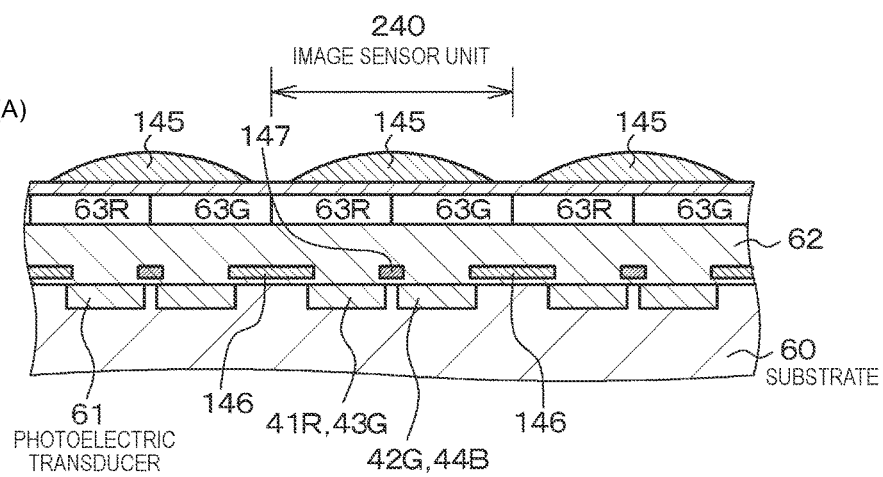
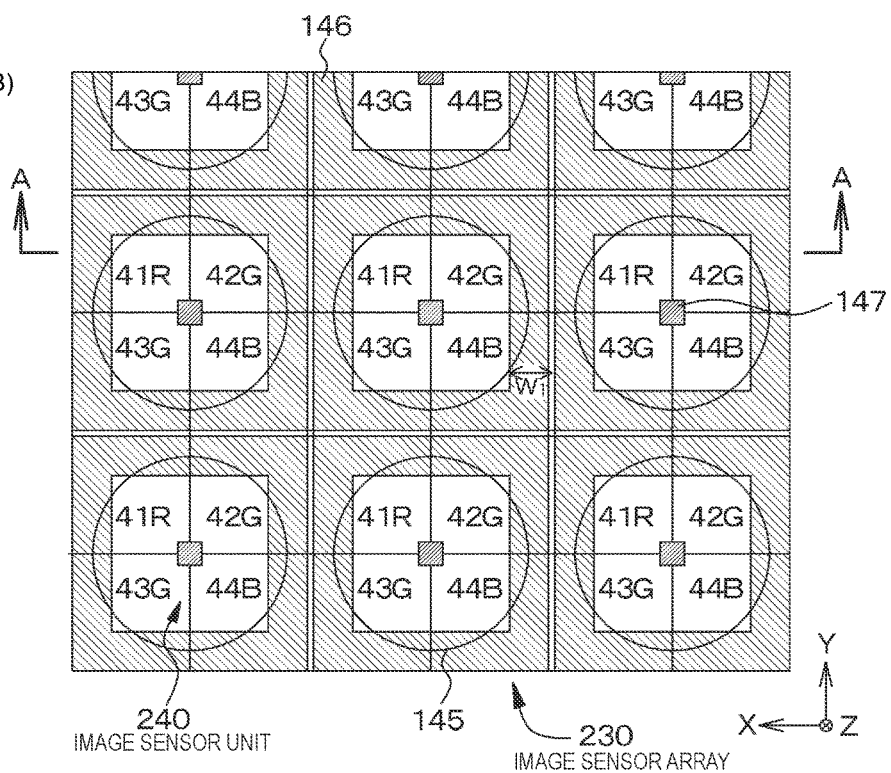

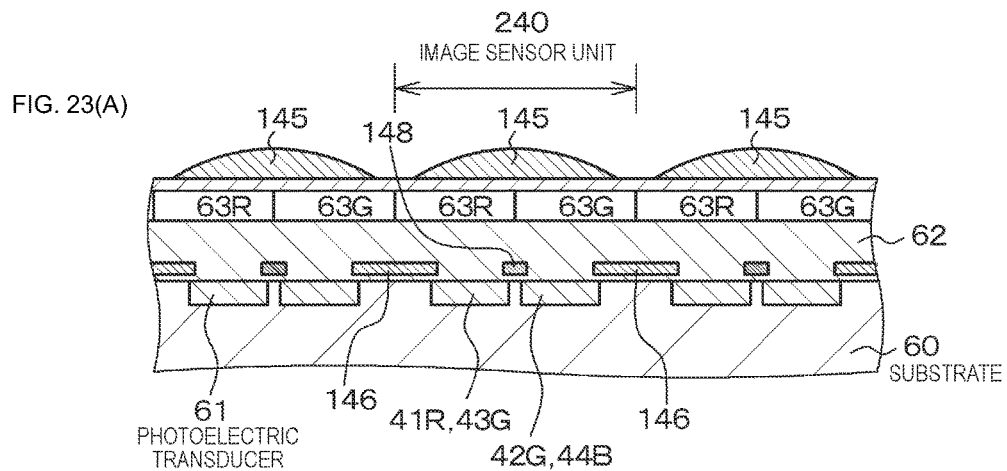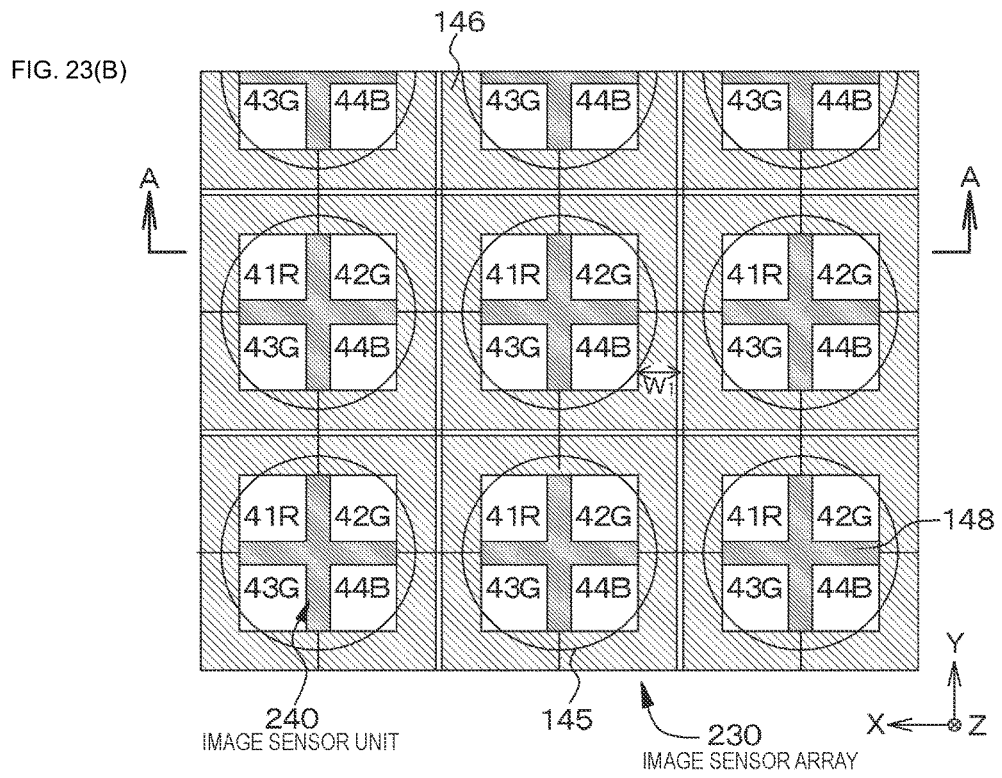

IMAGING APPARATUS AND IMAGE SENSOR ARRAY

RELATED APPLICATION DATA

This application is a continuation of U.S. patent application Ser. No. 13/771,865, filed Feb. 20, 2013, the entirety of which is incorporated herein by reference to the extent permitted by law. The present application claims the benefit of priority to Japanese Patent Application No. JP 2012-034974, filed on Feb. 21, 2012 in the Japan Patent Office, the entirety of which is incorporated by reference herein to the extent permitted by law.

BACKGROUND

The present disclosure relates to an imaging apparatus and an image sensor array, and more particularly, to an imaging apparatus that images a subject as a stereo image, and to an image sensor array used in such an imaging apparatus.

For some time, various imaging apparatus have been proposed and developed. Additionally, there have been proposed imaging apparatus configured to perform given image processing on an imaging signal obtained by imaging and output the result, such as an imaging apparatus that images a subject as a stereo image, for example. For example, International Publication No. 06/039486 proposes an imaging apparatus that uses a technique called light field photography. The imaging apparatus includes an imaging lens, a microlens array (light field lens), a photosensitive element, and an image processor. An imaging signal obtained from the photosensitive element includes information on the light intensity at the photosensitive surface of the photosensitive element, as well as information on the travel direction of that light. Additionally, on the basis of such an imaging signal, an observed image from an arbitrary viewpoint or direction may be reconstructed in the image processor to obtain a stereo image.

Alternatively, there has been proposed a system in which a common subject is simultaneously imaged by two video cameras disposed to the left and right of each other, and a stereo image is displayed by simultaneously outputting the two images thus obtained (a right-eye image and a left-eye image). However, when two video cameras are used in this way, the apparatus becomes bulky and is impractical. Moreover, the baseline between the two video cameras, or in other words, the interpupillary distance of the stereo camera, is often set to approximately 65 mm, equivalent to the distance between the human eyes, irrespective of the lens zoom ratio. In such cases, binocular parallax increases for close-up images and forces the viewer's visual system to process information differently from daily life, which can lead to eyestrain. Additionally, imaging a moving subject with two video cameras involves precise synchronization control of the two video cameras and is extremely difficult. Accurate control of the angle of convergence is also extremely difficult.

In order to make adjusting the lens system easier for stereo photography, there has been proposed a stereo photography apparatus that uses a shared optical system by introducing a polarization filter which polarizes incoming light such that respective rays become orthogonal to each other (see Japanese Examined Patent Application Publication No. H6-054991, for example).

Also proposed is a technique that conducts stereo photography with an imaging apparatus made up of two lenses and one imaging means (see Japanese Unexamined Patent Application Publication No. 2004-309868, for example). The imaging apparatus disclosed in this patent application publication is provided with imaging means in which a number of pixels corresponding to an integer multiple of a given number of scanlines are provided on an imaging surface, first horizontal component polarizing means that transmits only horizontal components in first image light from a subject, and first vertical component polarizing means, disposed separated from the first horizontal component polarizing means by a given distance, that transmits only vertical components in second image light from the subject, wherein the horizontal components transmitted by the first horizontal component polarizing means are condensed onto a given range of pixels on the imaging surface, and the vertical components transmitted by the first vertical component polarizing means are condensed onto a remaining range of pixels that excludes the given range. Specifically, a horizontal component polarizing filter and a vertical component polarizing filter are disposed separated by an interval corresponding to the parallax of the human eyes, and provided together with two lenses at a position separated from the imaging surface of a CCD by a given distance.

SUMMARY

However, the imaging apparatus disclosed in International Publication No. 06/039486 is problematic in that the imaging apparatus is bulky due to an increase in the number of components. Additionally, with the recent advances in higher definition (i.e., smaller pixels) for imaging apparatus, light field lenses demand extremely precise positioning.

Meanwhile, with the technology disclosed in Japanese Examined Patent Application Publication No. H6-054991, the lens system is shared by overlapping the output from two polarizing filters to merge the optical paths. However, additional polarizing filters are provided downstream for extraction of a right-eye image and a left-eye image, and the optical path itself is again split in order for the light to enter the separate polarizing filters. Thus, loss of light occurs in the lens system, in addition to other problems such as the difficulty of making the apparatus more compact. The technology disclosed in Japanese Unexamined Patent Application Publication No. 2004-309868 entails two pairs of a lens combined with a polarizing filter, and thus a more complex and bulky apparatus is difficult to avoid. Furthermore, using such imaging apparatus to photograph ordinary 2D images rather than just stereo images creates additional apparatus complexity, and is impractical.

In light of the foregoing, it is desirable to provide an imaging apparatus having a simple configuration and structure that is able to image a subject as a stereo image, as well as an image sensor array used in such an imaging apparatus.

According to a first, a second, and a third embodiments of the present disclosure to realize the above issues, there is provided an imaging apparatus including (A) an imaging lens and (B) an image sensor array in which a plurality of first image sensor units and a plurality of second image sensor units are arrayed. A single first image sensor unit includes a single first microlens and a plurality of image sensors, a single second image sensor unit includes a single second microlens and a single image sensor, light passing through the imaging lens and reaching each first image sensor unit passes through the first microlens and forms an image on the plurality of image sensors constituting the first image sensor unit, light passing through the imaging lens and reaching each second image sensor unit passes through the second microlens and forms an image on the image sensor constituting the second image sensor unit, and an inter-unit light shielding layer is formed between the image sensor units (specifically, at least between the first imaging unit and the second imaging unit, and between the second imaging units themselves).

In addition, in the imaging apparatus according to the first embodiment of the present disclosure to realize the above issues, a light shielding layer is not formed between the image sensor units themselves which constitute the first image sensor unit. Further, in the imaging apparatus according to the second embodiment of the present disclosure, an inter-device light shielding layer is formed only partially between the image sensors themselves which constitute the first image sensor unit. Furthermore, in the imaging apparatus according to the third embodiment of the present disclosure, an inter-device light shielding layer is formed between the image sensor units themselves which constitute the first image sensor unit.

According to the first, the second, and the third embodiments of the present disclosure, there is provided an image sensor array including a plurality of first image sensor units, and a plurality of second image sensor units arrayed therein. A single first image sensor unit includes a single first microlens and a plurality of image sensors, a single second image sensor unit includes a single second microlens and a single image sensor, and an inter-unit light shielding layer is formed between the image sensor units (specifically, at least between the first imaging unit and the second imaging unit, and between the second imaging units themselves).

In addition, in an image sensor array according to the first embodiment of the present disclosure, a light shielding layer is not formed between the image sensor units themselves which constitute the first image sensor unit. Further, in an image sensor array according to the second embodiment of the present disclosure, an inter-device light shielding layer is formed only partially between the image sensors themselves which constitute the first image sensor unit. Furthermore, in an image sensor array according to the third embodiment of the present disclosure, an inter-device light shielding layer is formed between the image sensor units themselves which constitute the first image sensor unit.

According to a fourth, a fifth, and a sixth embodiments of the present disclosure to realize the above issues, there is provided an imaging apparatus including (A) an imaging lens and (B) an image sensor array in which a plurality of image sensor units are arrayed. A single image sensor unit includes a single microlens and a plurality of image sensors, light passing through the imaging lens and reaching each image sensor unit passes through the microlens and forms an image on the plurality of image sensors constituting the image sensor unit, and an inter-unit light shielding layer is formed between the image sensor units themselves.

According to the fourth, the fifth, and the sixth embodiments of the present disclosure to realize the above issues, there is provided an image sensor array including a plurality of image sensor units arrayed therein. A single image sensor unit includes a single microlens and a plurality of image sensors. An inter-unit light shielding layer is formed between the image sensor units themselves In addition, in an imaging apparatus or an image sensor array according to the fourth embodiment of the present disclosure, an inter-device light shielding layer is formed between the image sensor units themselves which constitute the image sensor unit. Further, in an imaging apparatus or an image sensor array according to the fifth embodiment of the present disclosure, an inter-device light shielding layer is formed only partially between the image sensors themselves which constitute the image sensor unit. Furthermore, in an imaging apparatus or an image sensor array according to the sixth embodiment of the present disclosure, an inter-device light shielding layer is formed between the image sensor units themselves which constitute the image sensor unit.

In an imaging apparatus or image sensor array according to the first through third modes of the present disclosure, a single first image sensor unit includes a single first microlens and multiple image sensors, and image data for a stereo image can be obtained from such a first image sensor unit, while in addition, in an imaging apparatus or image sensor array according to the fourth through sixth modes of the present disclosure, a single image sensor unit includes a single microlens and multiple image sensors, and image data for a stereo image can be obtained from such an image sensor unit. For this reason, the imaging apparatus does not become bulky, extremely precise positioning of the first microlens (or microlens) is not demanded, and the problem of a large drop in resolution does not occur. Furthermore, an image sensor array can be manufactured without adding additional stages to the manufacturing process and without introducing special manufacturing processes. Moreover, a compact monocular imaging apparatus having a simple configuration and structure can be provided. Additionally, since the configuration does not involve two pairs of a lens combined with a polarizing filter, imbalances and discrepancies in factors such as zoom, aperture, focus, and angle of convergence do not occur. Moreover, since the baseline for binocular parallax is comparatively short, a natural stereoscopic effect can be achieved. Also, 2D images and 3D images can be easily obtained depending on how image data is processed.

BRIEF DESCRIPTION OF THE DRAWINGS

FIGS. 1(A) and 1(B) are, respectively, a schematic partial cross-section of an imaging apparatus or image sensor array according to Example 1, and a schematic illustration of how image sensors and microlenses are disposed therein;

FIG. 3 is a conceptual illustration of light reaching an image sensor array in an imaging apparatus according to Example 1;

FIG. 5(A) is a schematic illustration of a subject imaged by an imaging apparatus according to Example 1, while FIGS. 5(B) to 5(E) are conceptual illustrations of image data for a subject imaged by an imaging apparatus according to Example 1;

FIG. 8 is a schematic illustration highlighting how the second image sensor units are disposed in the image sensor array according to Example 1 illustrated in FIG. 6;

FIG. 15 is a schematic illustration highlighting how the second image sensor units are disposed in the other exemplary modification of an image sensor array according to Example 1 illustrated in FIG. 13;

FIGS. 16(A) and 16(B) are, respectively, a schematic partial cross-section of an imaging apparatus or image sensor array according to Example 2, and a schematic illustration of how image sensors and microlenses are disposed therein;

FIGS. 17(A) and 17(B) are, respectively, a schematic partial cross-section of an imaging apparatus or image sensor array according to Example 3, and a schematic illustration of how image sensors and microlenses are disposed therein;

FIGS. 20(A) and 20(B) are, respectively, a schematic partial cross-section of an imaging apparatus or image sensor array according to Example 6, and a schematic illustration of how image sensors and microlenses are disposed therein;

FIGS. 21(A) and 21(B) are, respectively, a schematic partial cross-section according to Example 7 (being an exemplary modification of an imaging apparatus or image sensor array according to Example 4), and a schematic illustration of how image sensor and microlenses are disposed therein;

FIGS. 22(A) and 22(B) are, respectively, a schematic partial cross-section according to Example 7 (being an exemplary modification of an imaging apparatus or image sensor array according to Example 5), and a schematic illustration of how image sensors and microlenses are disposed therein; and FIGS. 23(A) and 23(B) are, respectively, a schematic partial cross-section according to Example 7 (being an exemplary modification of an imaging apparatus or image sensor array according to Example 6), and a schematic illustration of how image sensors and microlenses are disposed therein.

DETAILED DESCRIPTION OF THE EMBODIMENT(S)

Figure 2A:
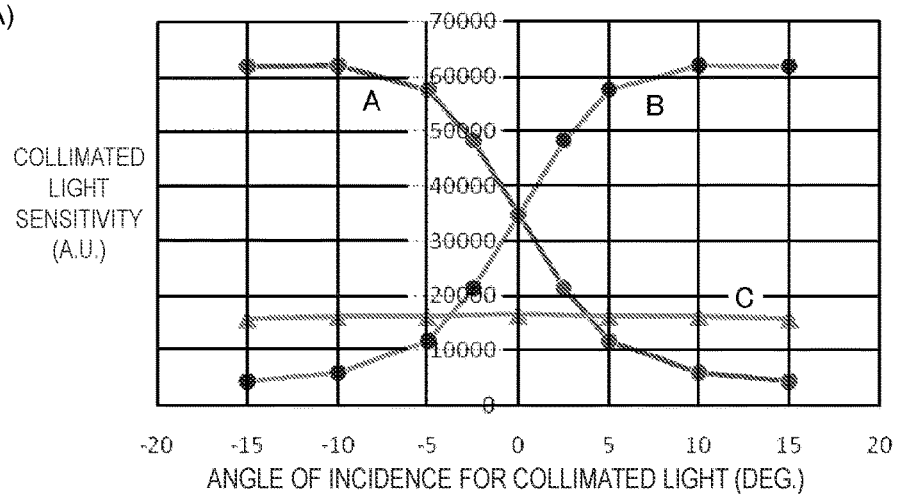
FIGS. 2(A) and 2(B) are graphs illustrating simulated results of the relationship between the sensitivity of image sensors constituting a first image sensor unit and the angle of incidence for light incident on the image sensors in an imaging apparatus or an image sensor array according to Example 1 and Example 2, respectively.

Hereinafter, preferred embodiments of the present disclosure will be described in detail with reference to the appended drawings. Note that, in this specification and the appended drawings, structural elements that have substantially the same function and structure are denoted with the same reference numerals, and repeated explanation of these structural elements is omitted.

Hereinafter, present disclosure will be described on the basis of examples, but the present disclosure is not limited to the examples, and the various numerical values and materials in the examples are for illustrative purposes. The description will proceed in the following order.

1. General description of imaging apparatus and image sensor array according to the first through sixth modes of the present disclosure
2. Example 1 (imaging apparatus and image sensor array according to the first mode of the present disclosure)
3. Example 2 (imaging apparatus and image sensor array according to the second mode of the present disclosure)
4. Example 3 (imaging apparatus and image sensor array according to the third mode of the present disclosure)
5. Example 4 (imaging apparatus and image sensor array according to the fourth mode of the present disclosure)
6. Example 5 (imaging apparatus and image sensor array according to the fifth mode of the present disclosure)
7. Example 6 (imaging apparatus and image sensor array according to the sixth mode of the present disclosure)
8. Example 7 (modifications of Examples 4 to 6) and other

[General Description of Imaging Apparatus and Image Sensor Array According to the First Through Sixth Modes of the Present Disclosure]

In the following description, a first image sensor unit in an imaging apparatus and image sensor array according to the first through third modes of the present disclosure and an image sensor unit in an imaging apparatus and image sensor array according to the fourth through sixth modes of the present disclosure may be collectively designated the "(first) image sensor unit" in some cases. Likewise, a first microlens in an imaging apparatus and image sensor array according to the first through third modes of the present disclosure and a microlens in an imaging apparatus and image sensor array according to the fourth through sixth modes of the present disclosure may be collectively designated the "(first) microlens" in some cases.

In an imaging apparatus or image sensor array according to the first through sixth modes of the present disclosure, a (first) image sensor unit includes four image sensors, these being a first image sensor, a second image sensor, a third image sensor, and a fourth image sensor, which may be embodied such that the first image sensor and the second image sensor are disposed along a first direction, the third image sensor is adjacent to the first image sensor along a second direction orthogonal to the first direction, and the fourth image sensor is adjacent to the second image sensor along the second direction.

Alternatively, in an imaging apparatus or image sensor array according to the second mode or the fifth mode of the present disclosure, a (first) image sensor unit includes four image sensors, these being a first image sensor, a second image sensor, a third image sensor, and a fourth image sensor, the first image sensor and the second image sensor are disposed along a first direction, the third image sensor is adjacent to the first image sensor along a second direction orthogonal to the first direction, and the fourth image sensor is adjacent to the second image sensor along the second direction, and an inter-device light shielding layer disposed in the boundary regions of the first image sensor, the second image sensor, the third image sensor, and the fourth image sensor. The planar shape of the inter-device light shielding layer may take a square pattern, but in some cases may also take a rectangular pattern that is elongated in the first direction. In the case where the planar shape of the inter-device light shielding layer is taken to be square, the length of an edge of the square is preferably from 0.1 to 0.2 times the length of an edge of an image sensor constituting the (first) image sensor unit. In the case where the planar shape of the inter-device light shielding layer is taken to be rectangular, the length of the long edge is preferably from 0.1 to 2 times the length of an edge of an image sensor constituting the (first) image sensor unit.

Furthermore, in the various preferable embodiments described above for an imaging apparatus or image sensor array according to the first through sixth modes of the present disclosure, take a first virtual plane to be the plane extending in the first direction that includes the normal line of the (first) microlens passing through the center of the (first) microlens, and take the normal line of the photosensitive surface of a photoelectric transducer discussed later to be the base of reference for the value of a center angle of incidence $\theta_0$ for all (first) image sensor units obtained by collimated light parallel to the first virtual plane from the spatial region above the first image sensor and the third image sensor that passes through the (first) microlens and reaches the second image sensor and the fourth image sensor. In this case, the value of the center angle of incidence $\theta_0$ satisfies:

$$0° \leq \theta_0 \leq 15°$$

Meanwhile, if $\theta_n$ is taken to be the angle of incidence and $(S\theta_n)$ is taken to be the received light intensity at an image sensor along each angle of incidence $\theta_n$, the center angle of incidence $\theta_0$ can be expressed as:

$$\theta_0 = \Sigma\{(\theta_n \times (S\theta_0))/(S\theta_n)\}$$

Alternatively, the baseline for binocular parallax between an image obtained from the first image sensor and the third image sensor versus an image obtained from the second image sensor and the fourth image sensor in all (first) image sensor units may be computed as $4f/(3\pi F)$, where f is the focal length of the imaging lens (in millimeters, for example) and F is the f-number.

Additionally, in an imaging apparatus or an image sensor array according to the first through third modes of the present disclosure that includes the preferable embodiments and configurations described above, a 1-pixel unit may be made up of multiple second image sensor units, and configured such that the surface area (or planar shape) occupied by a single first image sensor unit is equivalent to (or in a similar shape as) the surface area (or planar shape) occupied by a 1-pixel unit. Also, in this case, the width of an inter-unit light shielding layer in the first image sensor units may be configured to be greater than the width of the inter-unit light shielding layer in the second image sensor units. Thus, the amount of light bleed into the first image sensor units from the second image sensor units may be decreased. Furthermore, the inter-unit light shielding layers preferably satisfy $$0.1 \leq W_2/W_1 \leq 0.9$$

where $W_1$ is the width of the inter-unit light shielding layer in the first image sensor units, and $W_2$ is the width of the inter-unit light shielding layer in the second image sensor units. Also, in an imaging apparatus or an image sensor array according to the first through third modes of the present disclosure that includes these configurations, it may be configured such that the first image sensor unit includes four image sensors, and four second image sensor units constitute a 1-pixel unit.

In an imaging apparatus according to the first through third modes of the present disclosure, image data obtained from the first image sensor units can be combined with image data obtained from the second image sensor units to obtain data for a stereo image (right-eye image data and left-eye image data). Specifically, a stereo image may be obtained on the basis of image data obtained from the first and third image sensors (herein referred to as "first image data" for convenience), and image data obtained from the second and fourth image sensors (herein referred to as "second image data" for convenience) in all first image sensor units. Alternatively, depending on whether the imaging apparatus is arranged horizontally or vertically, a stereo image may be obtained on the basis of image data obtained from the first and second image sensors, and image data obtained from the third and fourth image sensors. The obtained stereo image may be based on the baseline for binocular parallax discussed earlier, for example. More specifically, a depth map (depth information) may be created on the basis of first image data and second image data, for example, and data for a stereo image (right-eye image data and left-eye image data) may be obtained from the depth map (depth information) and image data obtained from all second image sensor units. Note that the first image sensor units could also be referred to as "image sensor units for parallax detection", whereas the second image sensor units could also be referred to as "image sensor units for image generation".

In an imaging apparatus according to the fourth through sixth modes of the present disclosure, data for a stereo image (right-eye image data and left-eye image data) may be obtained on the basis of image data obtained from image sensor units. Specifically, a stereo image may be obtained on the basis of image data obtained from the first and third image sensors (first image data), and image data obtained from the second and fourth image sensors (second image data) in all image sensor units. Alternatively, depending on whether the imaging apparatus is arranged horizontally or vertically, a stereo image may be obtained on the basis of image data obtained from the first and second image sensors, and image data obtained from the third and fourth image sensors. Alternatively, a stereo image may be obtained on the basis of image data obtained from the first image sensor (first image data), image data obtained from the third image sensor (first image data), and image data obtained by processing image data obtained from the fourth image sensor (first image data), as well as image data obtained from the second image sensor (second image data), image data obtained from the fourth image sensor (second image data), and image data obtained by processing image data obtained from the first image sensor (second image data) in all image sensors. The obtained stereo image may be based on the baseline for binocular parallax discussed earlier, for example. Note that in this case, the image sensors are not only image sensor units for parallax detection, but also image sensor units for image generation.

In an imaging apparatus or image sensor array according to the first through third modes of the present disclosure, the first image sensor units may be disposed on the grid points of a lattice in a first direction and a second direction. In other words, it may be configured such that a single first image sensor unit is disposed in place of every Nth pixel unit (where N≥2) along a first direction, and in addition, a single first image sensor unit is disposed in place of every Mth pixel units (where M≥2, for example) along a second direction. Alternatively, it may be configured such that lines of first image sensor units are disposed in a lattice in a first direction and a second direction. In other words, it may be configured such that first image sensor units are disposed along the entirety of a row extending in a first direction, with one row of first image sensor units being disposed with respect to (M−1) pixel units (where M≥2, for example) along a second direction, while in addition, first image sensor units are disposed along the entirety of a column extending in the second direction, with one column of first image sensor units being disposed with respect to (N−1) pixel units (where N≥2, for example) along the first direction. Alternatively, it may be configured such that first image sensor units are disposed along the entirety of a row extending in a first direction, with one row of first image sensor units being disposed with respect to (M−1) pixel units (where M≥2, for example) along a second direction.

In an imaging apparatus or image sensor array according to the first through sixth modes of the present disclosure including the various preferable embodiments and configurations described above (hereinafter, these may be simply and collectively referred to as "the present disclosure" in some cases), the first direction may correspond to the horizontal direction of the image while the second direction corresponds to the vertical direction of the image in some cases, but the first direction may also correspond to the vertical direction of the image while the second direction corresponds to the horizontal direction of the image in other cases, depending on the arrangement of the imaging apparatus, or in other words, depending on whether the imaging apparatus is arranged horizontally or vertically. The question of whether the imaging apparatus is arranged horizontally or vertically may be detected by providing the imaging apparatus with an orientation detecting apparatus such as an acceleration sensor or a gyro sensor, for example, with the first direction and the second direction being determined appropriately on the basis of the detection results.

In the present disclosure, an image sensor constituting a second image sensor unit is realized by a photoelectric transducer as well as a color filter and a second microlens (on-chip lens) stacked on top of or above the photoelectric transducer. Alternatively, the image sensor may be realized by a photoelectric transducer as well as a second microlens (on-chip lens) and a color filter stacked on top of or above the photoelectric transducer. Regarding all points other than the light shielding layer, the configuration and structure of the image sensors constituting a (first) image sensor unit (the first image sensor, second image sensor, third image sensor, and fourth image sensor) may take the same configuration and structure as the image sensor constituting a second image sensor unit, and may furthermore take the configuration and structure of an image sensor constituting a second image sensor unit with the color filter removed, with the exception of the (first) microlens being formed instead of the second microlens (on-chip lens). Note that in the case of providing the first image sensor, second image sensor, third image sensor, and fourth image sensor with color filters, a color filter that transmits red light, a color filter that transmits green light, and a color filter that transmits blue light may be provided, or alternatively, a color filter that transmits light of a single color such as a color filter that transmits green light, for example, may be provided. Alternatively, a transparent layer may be formed or a neutral density filter may be provided instead of providing the first image sensor, second image sensor, third image sensor, and fourth image sensor with color filters.

A 1-pixel unit including multiple second image sensor units may be arranged in a Bayer array, for example. When using a Bayer array, each 1-pixel unit includes one red image sensor sensitive to red light, one blue image sensor sensitive to blue light, and two green image sensors sensitive to green light. However, the array of 1-pixel units made up of multiple second image sensor units is not limited to a Bayer array. Other potential arrays include interline arrays, G stripe RB mosaic arrays, G stripe RB full mosaic arrays, complementary mosaic arrays, stripe arrays, diagonal stripe arrays, primary chroma arrays, field sequential chroma arrays, frame sequential chroma arrays, MOS arrays, improved MOS arrays, frame-interleaved arrays, and field-interleaved arrays.

The imaging lens may be a fixed focal length lens, but may also be a zoom lens. The configuration and structure of the lens or lens system may be determined on the basis of the specifications demanded of the imaging lens. Potential image sensors include CCD sensors, CMOS sensors, and charge modulation device (CMD) signal amplifying image sensors. In addition, the imaging apparatus may be a front-illuminated solid-state imaging apparatus or a back-illuminated solid-state imaging apparatus. Furthermore, the imaging apparatus may constitute part of a digital still camera or video camera, camcorder, or a mobile phone with a built-in camera, commonly referred to as a camera phone.

Example 1

Figure 4A:
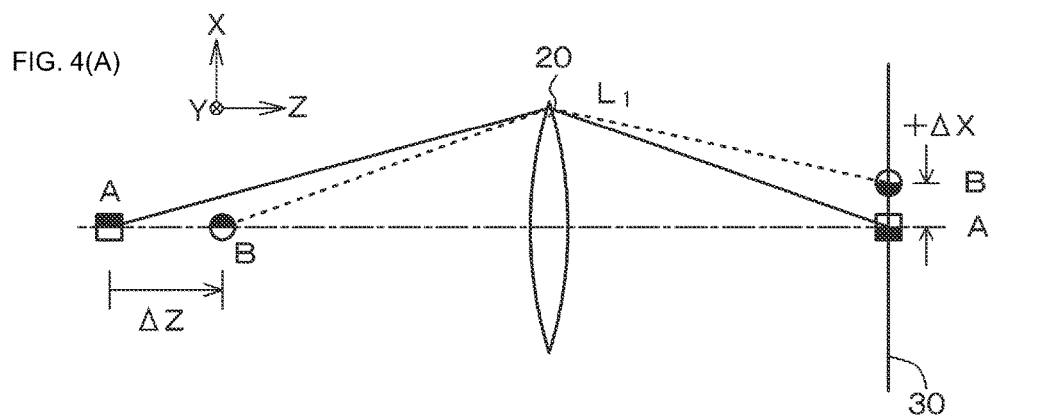
FIGS. 4(A) and 4(B) are conceptual illustrations of light reaching an image sensor array in an imaging apparatus according to Example 1, while FIGS. 4(C) and 4(D) schematically illustrate images formed on all first image sensor units in an image sensor array by the light illustrated in FIGS. 4(A) and 4(B)
Figure 4B:
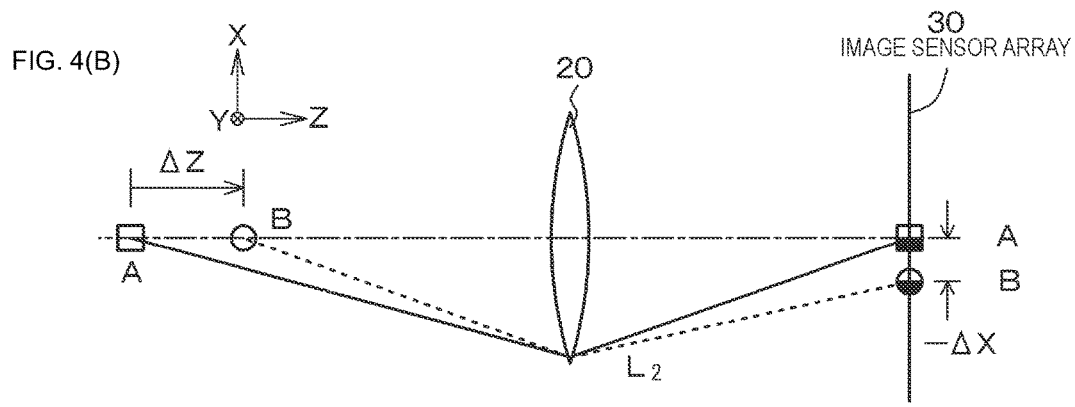
Figures 4C, 4D:
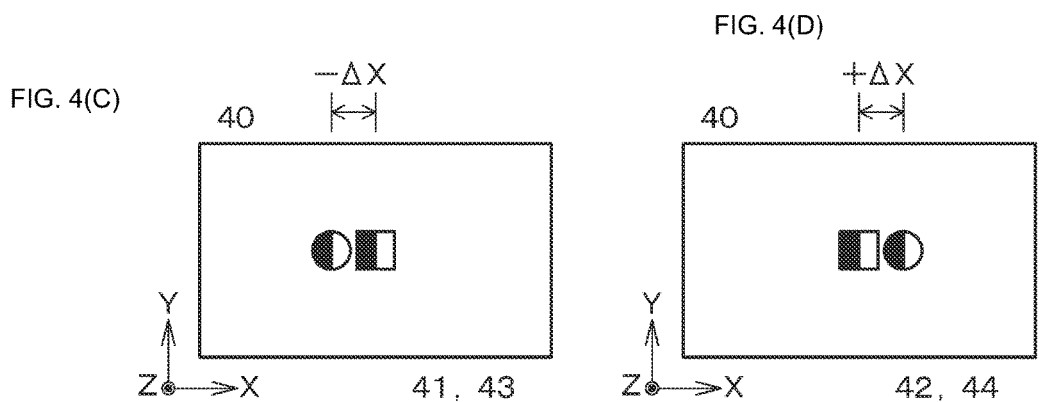

Example 1 relates to an imaging apparatus and image sensor array according to the first mode of the present disclosure. FIG. 1(A) illustrates a schematic partial cross-section of an imaging apparatus and image sensor array according to Example 1, while FIG. 1(B) schematically illustrates how image sensors and microlenses are disposed therein. FIG. 1(A) is a schematic partial cross-section view taken along the line A in FIG. 1(B). Also, FIG. 2(A) illustrates simulated results of the relationship between the sensitivity of image sensors constituting a first image sensor unit and the angle of incidence for incident light in an imaging apparatus and image sensor array according to Example 1. FIGS. 3, 4(A), and 4(B) conceptually illustrate light reaching an image sensor array in an imaging apparatus according to Example 1, while FIGS. 4(C) and 4(D) schematically illustrate images imaging formed on an image sensor array by the light illustrated in FIGS. 4(A) and 4(B). Also, FIG. 5(A) schematically illustrates a subject imaged by an imaging apparatus according to Example 1, while FIGS. 5(B) to 5(E) conceptually illustrate image data for a subject imaged by an imaging apparatus according to Example 1.

Figure 6:
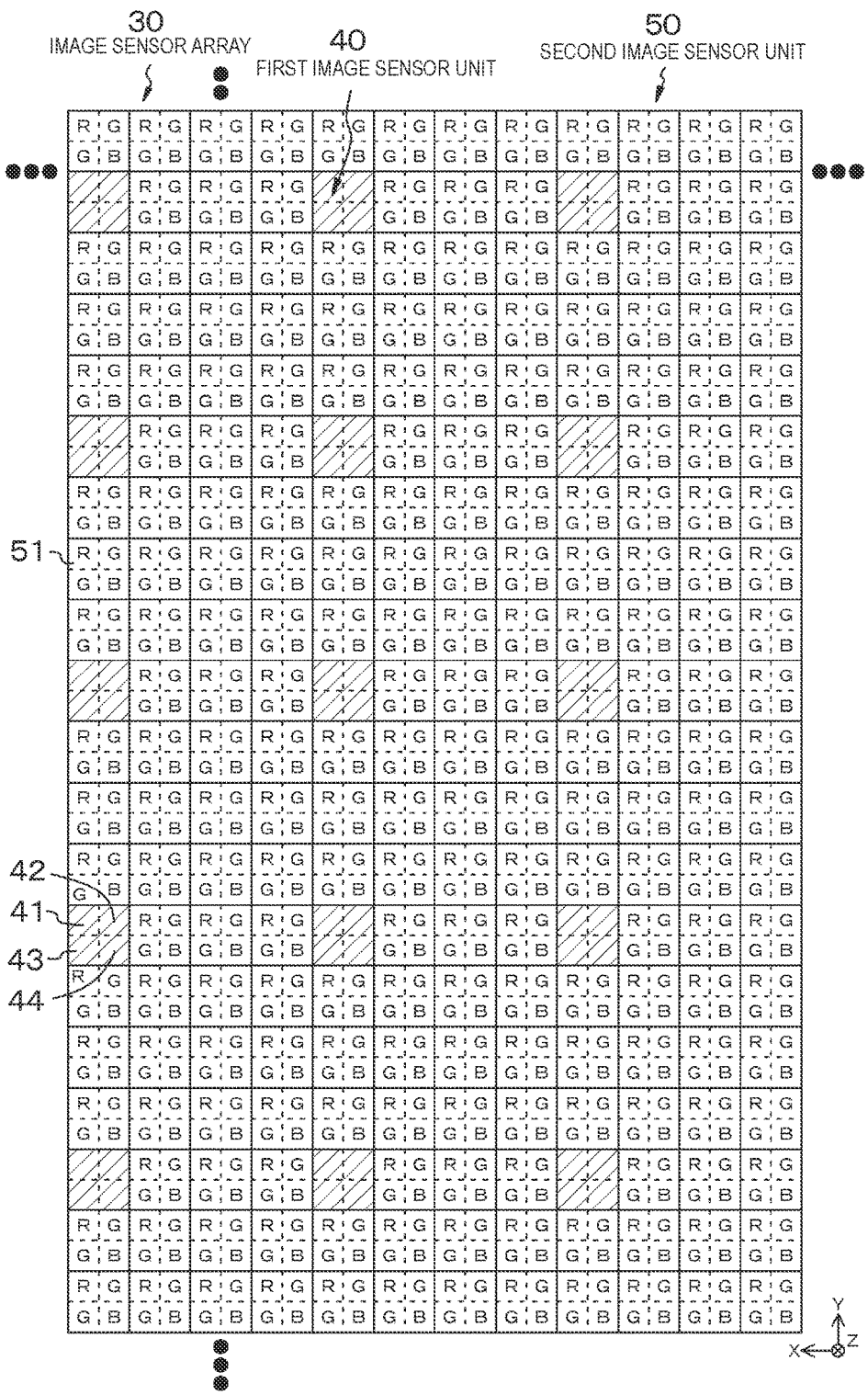
FIG. 6 schematically illustrates how first image sensor units and second image sensor units are disposed in an image sensor array according to Example 1.
Figure 7:
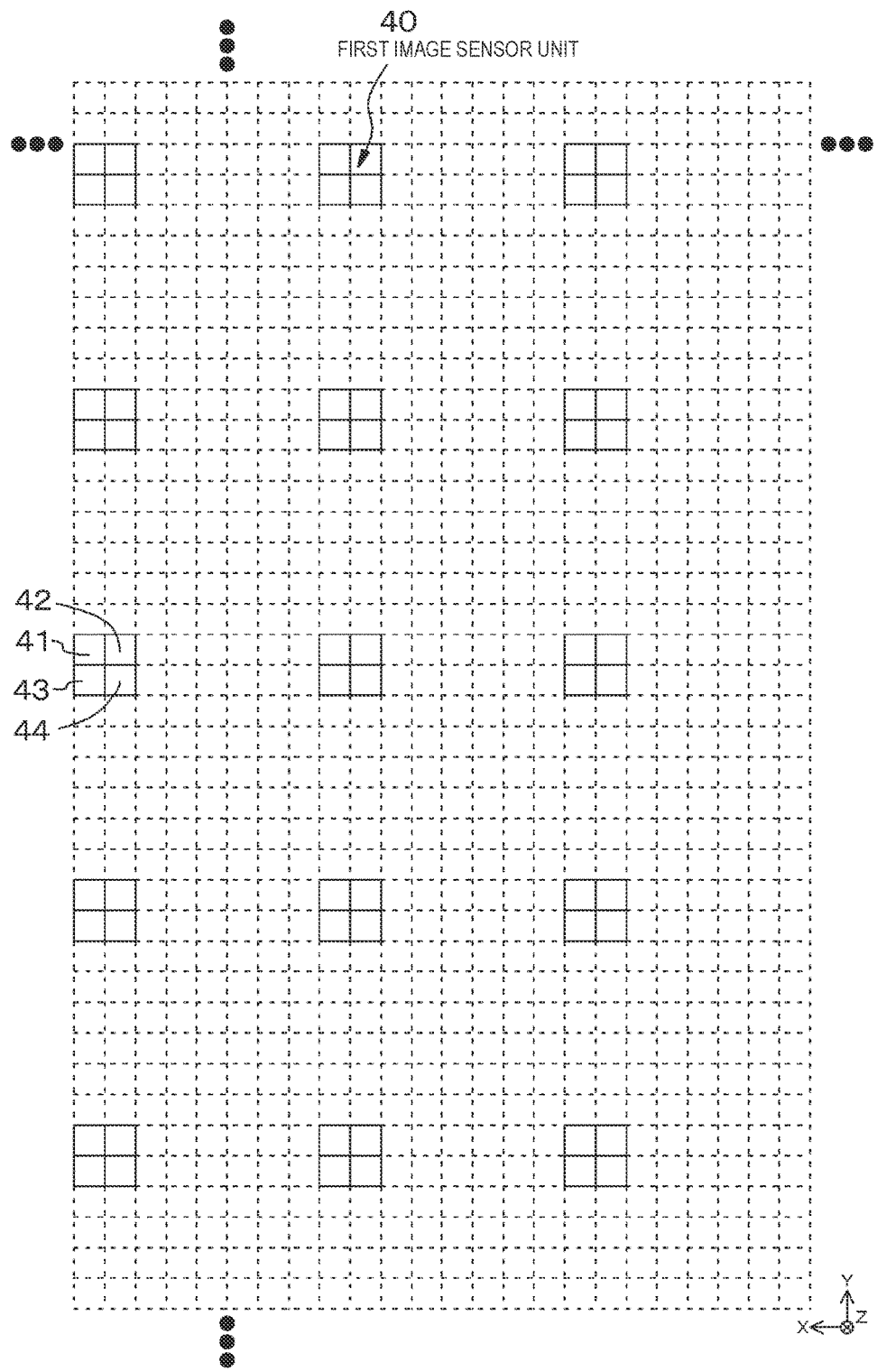
FIG. 7 is a schematic illustration highlighting how the first image sensor units are disposed in the image sensor array according to Example 1 illustrated in FIG. 6.
Figure 8:
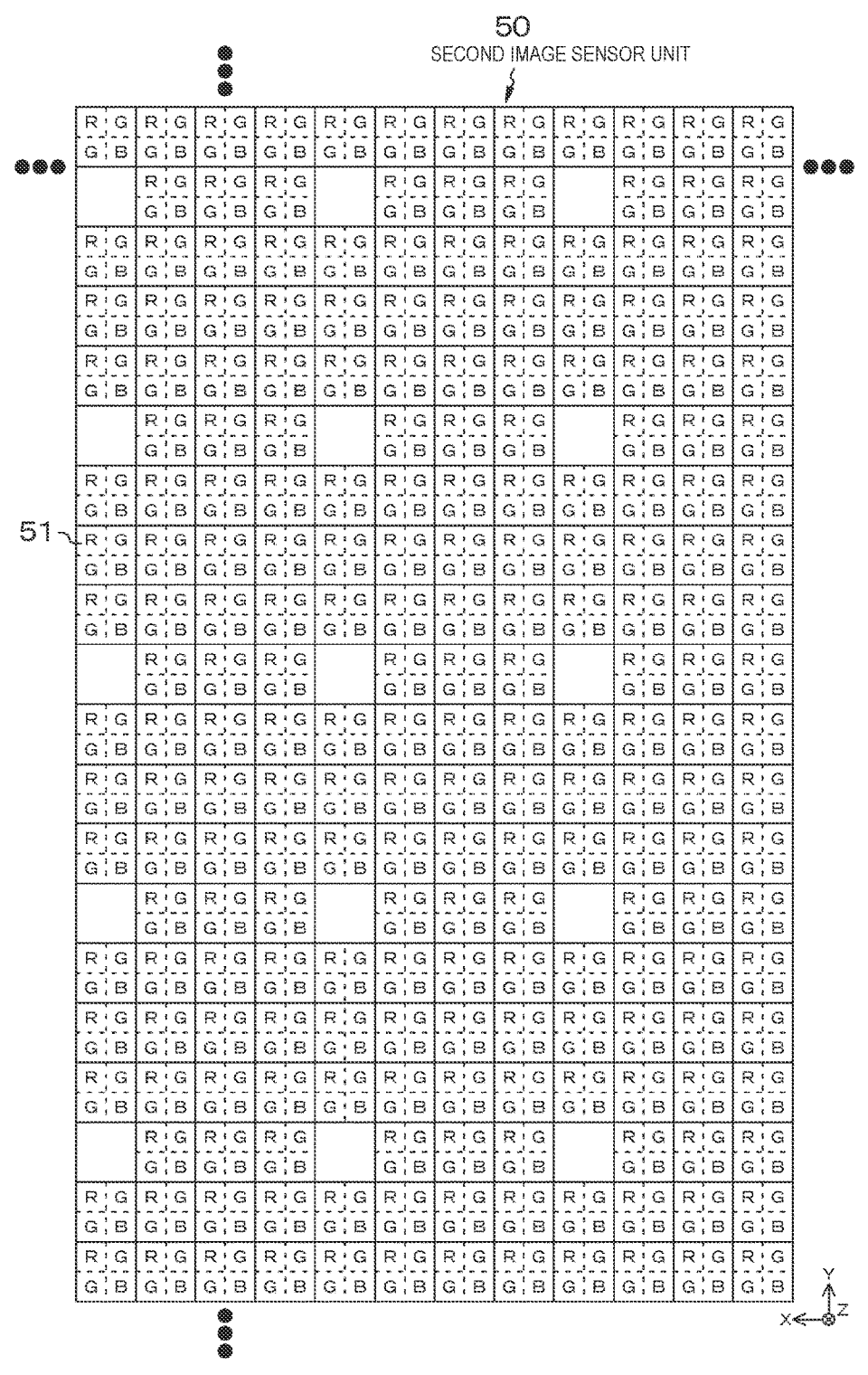
Figure 9:
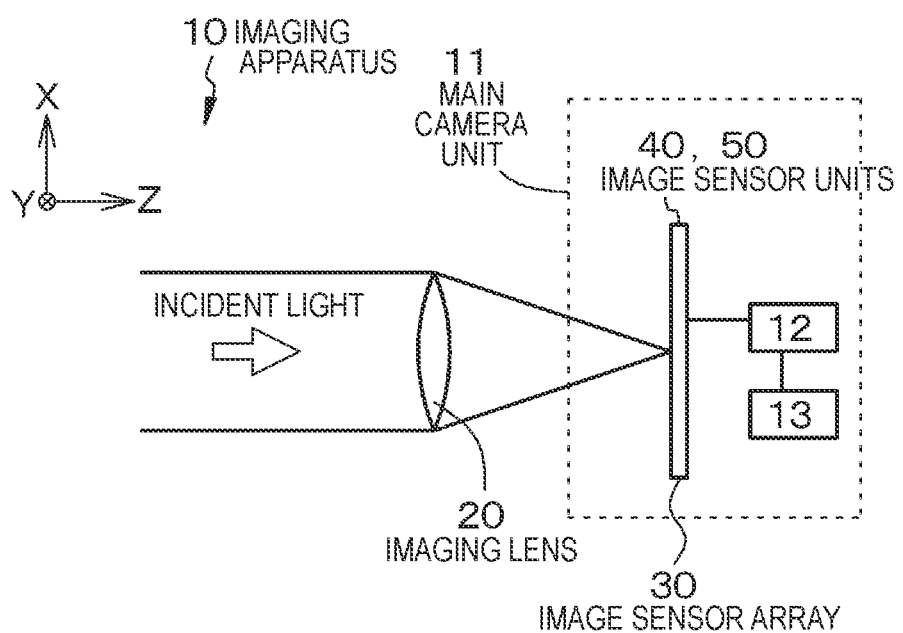
FIG. 9 is a conceptual illustration of an imaging apparatus according to Example 1.

Additionally, FIG. 6 schematically illustrates how first image sensor units and second image sensor units are disposed in an image sensor array, while FIG. 7 is a schematic illustration highlighting how the first image sensor units are disposed in the image sensor array illustrated in FIG. 6, and FIG. 8 is a schematic illustration highlighting how the second image sensor units are disposed in the image sensor array illustrated in FIG. 6. FIG. 9 is a conceptual illustration of an imaging apparatus. Note that as a general rule in the following description, the first direction corresponds to the horizontal direction of the image and the second direction corresponds to the vertical direction of the image. For the sake of convenience, the first direction is taken to be the X direction and the second direction the Y direction, while the travel direction of light is taken to be the Z direction.

An imaging apparatus 10 according to Example 1 or Examples 2 to 3 later discussed includes (A) an imaging lens 20, and (B) an image sensor array 30 in which multiple first image sensor units 40 and multiple second image sensor units 50 are arrayed, wherein a single first image sensor unit 40 includes a single first microlens 45 and multiple image sensors, and a single second image sensor unit 50 includes a single second microlens 55 and a single image sensor 51. Also, light passing through the imaging lens 20 and reaching each first image sensor unit 40 passes through the first microlens 45 and forms an image on the multiple image sensors constituting the first image sensor unit 40, and light passing through the imaging lens 20 and reaching each second image sensor unit 50 passes through the second microlens 55 and forms an image on the image sensor 51 constituting the second image sensor unit 50. Furthermore, inter-unit light shielding layers 46 and 56 are formed between image sensor units (specifically, at least between the first image sensor units 40 and the second image sensor units 50 and between the second image sensor unit 50 themselves, and more specifically, between the first image sensor units 40 and the second image sensor units 50 and between the second image sensor units 50 themselves in this Example).

Note that in FIG. 1(B), image sensor boundaries are indicated by solid lines, and the inter-unit light shielding layers 46 and 56 are shaded. However, the inter-unit light shielding layer 56 is shaded in one location only. Also, the photoelectric transducer 61 later discussed is illustrated as a square shape, while the first microlens 45 and the second microlens 55 are illustrated as circular shapes, and the 1-pixel unit 50A is illustrated as a double-lined square. FIGS. 16(B), 17(B), 18(B), 19(B), and 20(B) are illustrated similarly.

Also, an image sensor array according to Example 1 or Examples 2 to 3 later discussed is an image sensor array 30 in which multiple first image sensor units 40 and multiple second image sensor units 50 are arrayed, wherein a single first image sensor unit 40 includes a single first microlens 45 and multiple image sensors, a single second image sensor unit 50 includes a single second microlens 55 and a single image sensor 51, and inter-unit light shielding layers 46 and 56 are formed between image sensor units (specifically, at least between the first image sensor units 40 and the second image sensor units 50 and between the second image sensor unit 50 themselves, and more specifically, between the first image sensor units 40 and the second image sensor units 50 and between the second image sensor units 50 themselves in this Example).

In addition, in the imaging apparatus 10 or the image sensor array 30 according to Example 1, a light shielding layer is not formed between the image sensors themselves which constitute the first image sensor unit 40.

In the imaging apparatus 10 according to Example 1 or Examples 2 to 6 later discussed, the imaging lens 20 causes light to form an image on the image sensor array 30. The image sensor array 30 is disposed inside a main camera unit 11. The imaging apparatus may constitute part of a digital still camera or video camera, for example.

Besides the image sensor array 30, the main camera unit 11 is equipped with an image processor 12 and image storage 13, for example. Additionally, right-eye image data and left-eye image data is formed on the basis of electrical signals converted by the image sensor array 30. The image sensor array 30 may be realized with a charge-coupled device (CCD) or complementary metal-oxide-semiconductor (CMOS) image sensor, for example. The image processor 12 converts electrical signals output from the image sensor array 30 into right-eye image data and left-eye image data, which is recorded to the image storage 13.

In Example 1 or Examples 2 to 3 later discussed, the first image sensor unit 40 includes four image sensors, these being a first image sensor 41, a second image sensor 42, a third image sensor 43, and a fourth image sensor 44. Also, the first image sensor 41 and the second image sensor 42 are disposed along a first direction (X direction), the third image sensor 43 is adjacent to the first image sensor 41 along a second direction (Y direction) orthogonal to the first direction, and the fourth image sensor 44 is adjacent to the second image sensor 42 along the second direction.

In Example 1 or Examples 2 to 6 later discussed, the first image sensor 41, the second image sensor 42, the third image sensor 43, and the fourth image sensor 44 are disproportionately disposed towards the center of the first image sensor unit 40 (or the image sensor unit 140). Stated differently, the centers of the image sensors 41, 42, 43, and 44 are not aligned with the centers of the photoelectric transducers 61 respectively constituting the image sensors 41, 42, 43, and 44, such that the distance from the centers of the photoelectric transducers 61 respectively constituting the image sensors 41, 42, 43, and 44 to the center of the first image sensor unit 40 (or the image sensor unit 140) is shorter than the distance from the centers of the image sensors 41, 42, 43, and 44 to the center of the first image sensor unit 40 (or the image sensor unit 140). In contrast, the center of the image sensor 51 is aligned with the center of the second image sensor unit 50.

Also, in Example 1 or Examples 2 to 3 later discussed, a 1-pixel unit 50A includes multiple second image sensor units 50, such that the surface area (or planar shape) occupied by a single first image sensor unit 40 is equivalent to (or in a similar shape as) the surface area (or planar shape) occupied by a 1-pixel unit 50A. Additionally, the width of the inter-unit light shielding layer 46 in the first image sensor unit 40 is greater than the width of the inter-unit light shielding layer 56 in the second image sensor unit 50. Although not limited thereto, the ratio of the widths of the inter-unit light shielding layers 46 and 56 is herein taken to be $W_2/W_1=0.15$, where $W_1$ is the width of the inter-unit light shielding layer 46 in the first image sensor unit 40, and $W_2$ is the width of the inter-unit light shielding layer 56 in the second image sensor unit 50. Furthermore, as discussed earlier, the first image sensor unit 40 includes four image sensors, and four second image sensor units 50 constitute a 1-pixel unit 50A. Note that the value of the width $W_1$ in Example 2 or Example 3 later discussed is the same value as in Example 1.

Specifically, in this Example, the 1-pixel unit 50A including multiple second image sensor units 50 is arranged in a Bayer array. The 1-pixel unit 50A includes one red image sensor 51R sensitive to red light (in some cases labeled "R" in the drawings), two green image sensors 51G sensitive to green light (in some cases labeled "G" in the drawings), and one blue image sensor 51B (in some cases labeled "B" in the drawings).

The red image sensor 51R constituting the second image sensor unit 50 is realized by a photoelectric transducer 61, as well as a first inter-layer insulating layer 62, a color filter 63R, a second inter-layer insulating layer 64, and a second microlens (on-chip lens) 55 stacked on top of the photoelectric transducer 61. The green image sensor 51G constituting the second image sensor unit 50 is realized by a photoelectric transducer 61, as well as a first inter-layer insulating layer 62, a color filter 63G a second inter-layer insulating layer 64, and a second microlens (on-chip lens) 55 stacked on top of the photoelectric transducer 61. The blue image sensor 51B constituting the second image sensor unit 50 is realized by a photoelectric transducer 61, as well as a first inter-layer insulating layer 62, a color filter 63B (not illustrated), a second inter-layer insulating layer 64, and a second microlens (on-chip lens) 55 stacked on top of the photoelectric transducer 61. An inter-unit light shielding layer 56 is formed between the second image sensor units 50 themselves. The photoelectric transducers 61 may be provided on a silicon semiconductor substrate 60, for example. Traces (not illustrated) are formed underneath the photoelectric transducers 61.

Meanwhile, the image sensors constituting the first image sensor unit 40 (the first image sensor 41, second image sensor 42, third image sensor 43, and fourth image sensor 44) have a similar structure as an image sensor constituting a second image sensor unit 50, with the exception of a first microlens 45 being formed instead a second microlens (on-chip lens) 55, and a color filter 63G' that transmits green light being provided for the first image sensor 41, second image sensor 42, third image sensor 43, and fourth image sensor 44. Specifically, the image sensors 41, 42, 43, and 44 constituting the first image sensor unit 40 are realized by a photoelectric transducer 61, as well as a first inter-layer insulating layer 62, a color filter 63G', a second inter-layer insulating layer 64, and a first microlens 45 stacked on top of the photoelectric transducer 61. The first microlens 45 covers the four image sensors 41, 42, 43, and 44. The second microlens 55 is not formed on the image sensors constituting the first image sensor unit 40. The first microlens 45 and the second microlens 55 are formed on the second inter-layer insulating layer 64. The photoelectric transducers 61 in the image sensors 41, 42, 43, and 44 constituting the first image sensor unit 40 may be the same size or smaller than the photoelectric transducer 61 in the image sensor 51 constituting the second image sensor unit 50.

In the imaging apparatus 10 or image sensor array 30 according to Example 1, first image sensor units 40 may be disposed on the grid points of a lattice in a first direction and a second direction. In other words, a single first image sensor unit 40 is disposed in place of every Nth 1-pixel unit 50A along a first direction (where $N=2^n$ with n being a natural number from 1 to 5, for example; in the example illustrated in the drawings, n=2), and in addition, a single first image sensor unit 40 is disposed in place of every Mth 1-pixel unit 50A along a second direction (where $M=2^m$ with m being a natural number from 1 to 5, for example; in the example illustrated in the drawings, m=2).

Figure 2B:
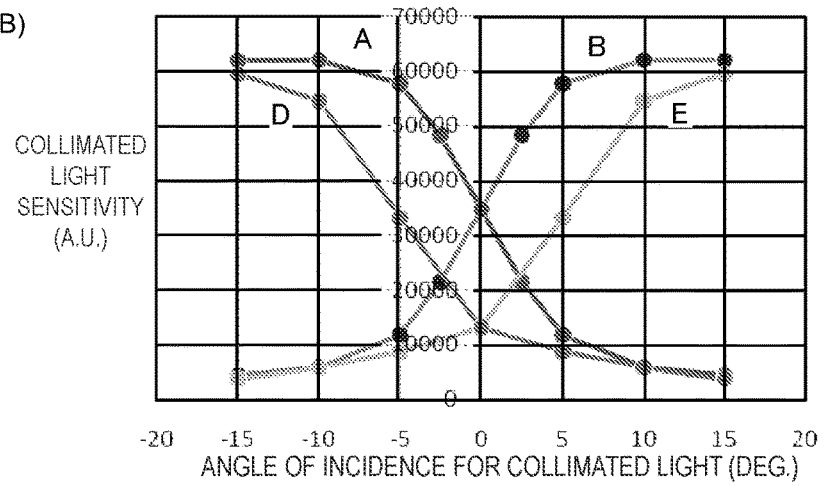

Meanwhile, the graph in FIG. 2(A) illustrates simulated results of the relationship between the sensitivity of the image sensors 41, 42, 43, and 44 constituting the first image sensor unit 40 and the angle of incidence for incident light in the imaging apparatus 10 or image sensor array 30 according to Example 1. In FIGS. 2(A) and 2(B), the horizontal axis represents the angle of incidence θ (in units of degrees) for light incident on the microlenses, while the vertical axis represents the sensitivity (in arbitrary units). In FIGS. 2(A) and 2(B) herein, take a first virtual plane to be the plane extending in the first direction that includes the normal line of the first microlens 45 passing through the center of the first microlens 45 (i.e., the plane parallel to the plane of the page in FIG. 1(A) and perpendicular to the plane of the page in FIG. 1(B)). In this case, the angle of incidence θ takes a negative value when collimated light parallel to the first virtual plane from the spatial region above the first image sensor 41 and the third image sensor 43 passes through the first microlens 45 and reaches the second image sensor 42 and the fourth image sensor 44.

Herein, the curve A in FIG. 2(A) illustrates the sensitivity characteristics of the second image sensor 42 and the fourth image sensor 44, the curve B illustrates the sensitivity characteristics of the first image sensor 41 and the third image sensor 43, and the curve C illustrates the sensitivity characteristics of the green image sensor 51G FIG. 2(A) demonstrates that in the case where the value of the angle of incidence θ is negative, the sensitivity of the second image sensor 42 and the fourth image sensor 44 is high, while the sensitivity of the first image sensor 41 and the third image sensor 43 is low. Conversely, in the case where the value of the angle of incidence θ is positive, the sensitivity of the second image sensor 42 and the fourth image sensor 44 is low, while the sensitivity of the first image sensor 41 and the third image sensor 43 is high. Consequently, first image data is generated by rays with a positive angle of incidence, or in other words by the first image sensor 41 and the third image sensor 43, whereas second image data is generated by rays with a negative angle of incidence, or in other words by the second image sensor 42 and the fourth image sensor 44. In this way, by disposing four image sensors 41, 42, 43, and 44 in the first image sensor unit 40 according to Example 1, a depth map for obtaining two sets of image data (right-eye image data and left-eye image data) can be created on the basis of first image data and second image data from all first image sensor units 40. Electrical signals from these image sensors 41, 42, 43, and 44 are then output simultaneously or in an alternating time series, and the output electrical signals (i.e., the electrical signals output from the first image sensor units 40 and the second image sensor units 50 in the image sensor array 30) are processed by the image processor 12 and recorded to the image storage 13 as right-eye image data and left-eye image data.

FIG. 3 is a schematic illustration of light reaching the image sensor array 30 in the imaging apparatus 10 according to Example 1 from the perspective of the imaging apparatus as a whole. The light indicated in broken lines corresponds to light incident on the right eye, while the light indicated in solid lines corresponds to light incident on the left eye. Such light indicated in broken lines that corresponds to light incident on the right eye is almost entirely received by the first image sensor 41 and the third image sensor 43 in the first image sensor units 40. Meanwhile, the light indicated in solid lines that corresponds to light incident on the left eye is almost entirely received by the second image sensor 42 and the fourth image sensor 44 in the first image sensor units 40. Thus, image data separated into first image data and second image data used to generated right-eye image data and left-eye image data can be obtained from all first image sensor units 40, even though the image sensor array 30 has a simple configuration and structure.

FIG. 2(A) demonstrates that the value of the center angle of incidence $\theta_0$ (in degrees) obtained by collimated light parallel to the first virtual plane from the spatial region above the first image sensor 41 and the third image sensor 43 passing through the first microlens 45 and reaching the second image sensor 42 and the fourth image sensor 44 in all first image sensor units 40 is $$\theta_0 = 3.5°$$

in the case where F=2.8. Also, the baseline for binocular parallax between an image obtained from the first image sensor 41 and the third image sensor 43 and an image obtained from the second image sensor 42 and the fourth image sensor 44 in all first image sensor units 40 is 4.2 mm in the case where f=35 mm and F=2.8.

Assume that the imaging lens 20 is focused on an object A with a square shape, as schematically illustrated in FIGS. 4(A) and 4(B). Also assume that an object B with a round shape is disposed closer to the imaging lens 20 than the object A. An image of the square object A is formed in focus on the image sensor array 30. Also, an image of the round object B is formed out of focus on the image sensor array 30. Additionally, in the example illustrated in FIG. 4(A), an image of the object B is formed on the image sensor array 30 at a position displaced to the right of the object A by a distance +ΔX. Meanwhile, in the example illustrated in FIG. 4(B), an image of the object B is formed on the image sensor array 30 at a position displaced to the left of the object A by a distance −ΔX. Consequently, the distance 2ΔX becomes information regarding the depth of the object B. In other words, the amount and direction of the bokeh of an object positioned closer to the imaging apparatus 10 than the object A differs from the amount and direction of the bokeh of an object positioned farther away from the imaging apparatus 10, and the amount of bokeh of the object B differs depending on the distance between the object A and the object B. Thus, a stereo image with the baseline for binocular parallax discussed above can be obtained. In other words, image data obtained from all first image sensor units 40 [i.e., first image data (see the schematic diagram in FIG. 4(C)) and second image data (see the schematic diagram in FIG. 4(D))] can be combined with image data obtained from all second image sensor units 50 in this way to obtain data for a stereo image (right-eye image data and left-eye image data). In other words, a depth map (depth information) may be created on the basis of first image data obtained from the first image sensor 41 and the third image sensor 43 and second image data obtained from the second image sensor 42 and the fourth image sensor 44 in all first image sensor units 40, for example, and data for a stereo image (right-eye image data and left-eye image data) may be obtained from this depth map (depth information) and image data obtained from all second image sensor units 50. Note that such a method itself may be an established method in the related art.

FIG. 5(A) schematically illustrates subjects imaged by an imaging apparatus according to Example 1, while FIGS. 5(B) to 5(E) conceptually illustrate image data for subjects imaged by an imaging apparatus according to Example 1. The subjects imaged by the imaging apparatus according to Example 1 are taken to be bars extending in the second direction. As illustrated in FIG. 5(A), the subjects herein are three bars labeled A, B, and C. Bar A is positioned closest to the imaging apparatus, with bar B and C being successively positioned farther away from the imaging apparatus. Also, assume that the bar B is in focus. Consequently, an image $A_C$ of the bar A is in focus behind the image sensor array 30, whereas an image $C_C$ of the bar C is in focus in front of the image sensor array 30. In such a state, the image data conceptually illustrated in FIG. 5B can be obtained in the second image sensor units 50 of the image sensor array 30. Also, FIG. 5(C) conceptually illustrates image data (first image data) based on the first image sensor 41 and the third image sensor 43 in the first image sensor units 40 of the image sensor array 30, with the images of the subject bars A, B, and C being labeled $A_C$, $B_R$, and $C_R$. Meanwhile, FIG. 5(D) conceptually illustrates image data (second image data) based on the second image sensor 42 and the fourth image sensor 44 in the first image sensor units 40 of the image sensor array 30, with the images of the subject bars A, B, and C being labeled $A_C$, $B_L$, and $C_L$. Note that in FIGS. 5(C) and 5(D), the images $B_C$ and $C_C$ are also displayed in broken lines for reference. Furthermore, FIG. 5(E) conceptually illustrates image data superimposing the first image data and the second image data. Herein, the image $B_R$ and the image $B_L$ of the bar B are separated by 2ΔB. Moreover, in FIG. 5(E), the image $B_R$ is positioned to the left while the image $B_L$ is positioned to the right. Likewise, the image $C_R$ and the image $C_L$ of the bar C are separated by 24C. Moreover, in FIG. 5E, the image $C_L$ is positioned to the left while the image $C_R$ is positioned to the right. In this way, by computing the positions and distances of images obtained from the first image data and second image data, the relative positional relationships among in-focus subjects can be ascertained.

As above, in an imaging apparatus or image sensor array according to Example 1, a single first image sensor unit includes a single first microlens and multiple image sensors, and image data for a stereo image can be obtained from all such first image sensor units. For this reason, the imaging apparatus does not become bulky, extremely precise positioning of the first microlens is not demanded, and the problem of a large drop in resolution does not occur. Furthermore, an image sensor array can be manufactured without adding additional stages to the manufacturing process and without introducing special manufacturing processes. Moreover, a compact monocular imaging apparatus having a simple configuration and structure can be provided. Additionally, since the configuration does not involve two pairs of a lens combined with a polarizing filter, imbalances and discrepancies in factors such as zoom, aperture, focus, and angle of convergence do not occur. Also, since the baseline for binocular parallax is comparatively short, natural stereo images can be obtained, while 2D images and 3D images can be easily obtained depending on how image data is processed.

Figure 10:
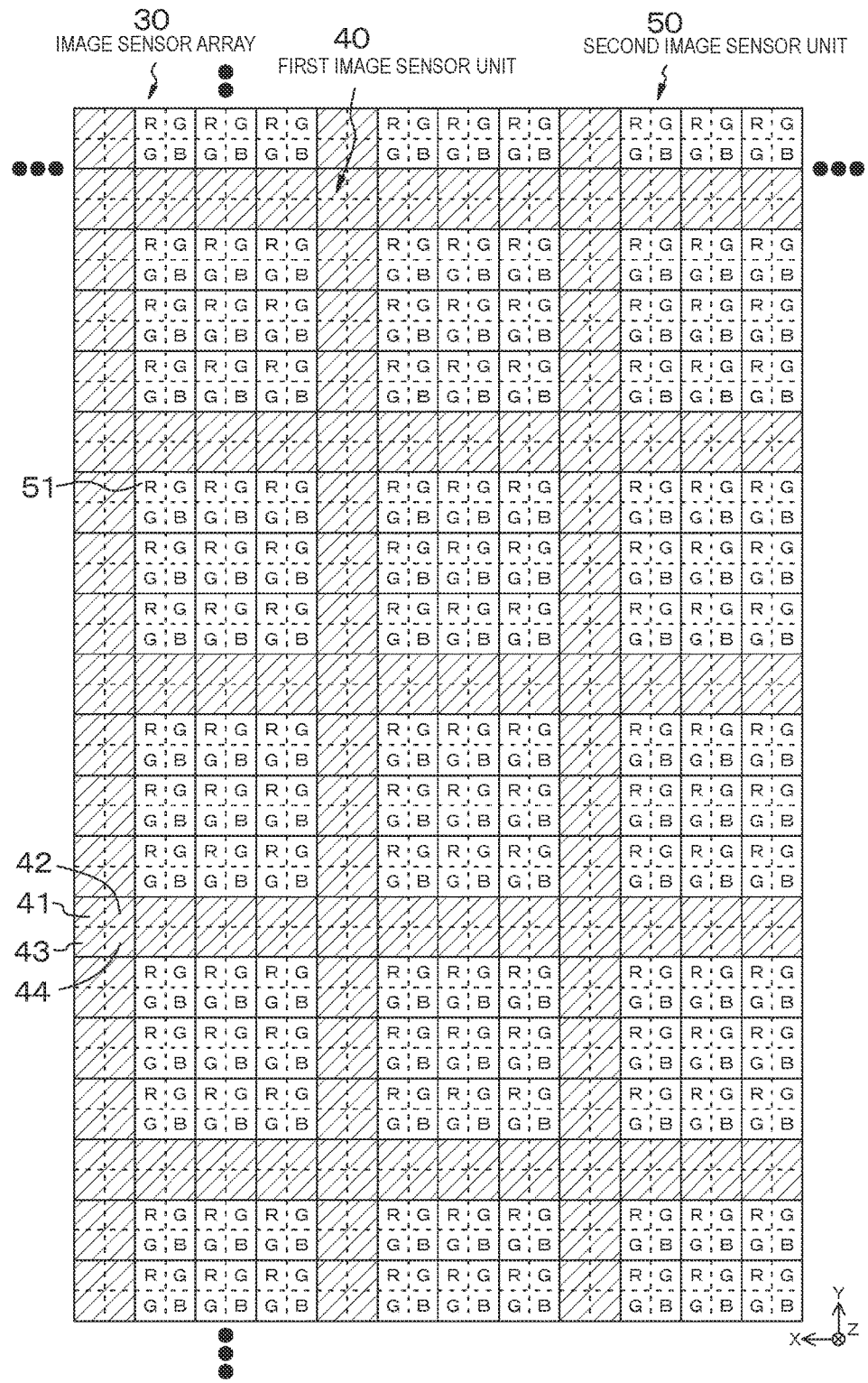
FIG. 10 schematically illustrates how first image sensor units and second image sensor units are disposed in an exemplary modification of an image sensor array according to Example 1.
Figure 11:
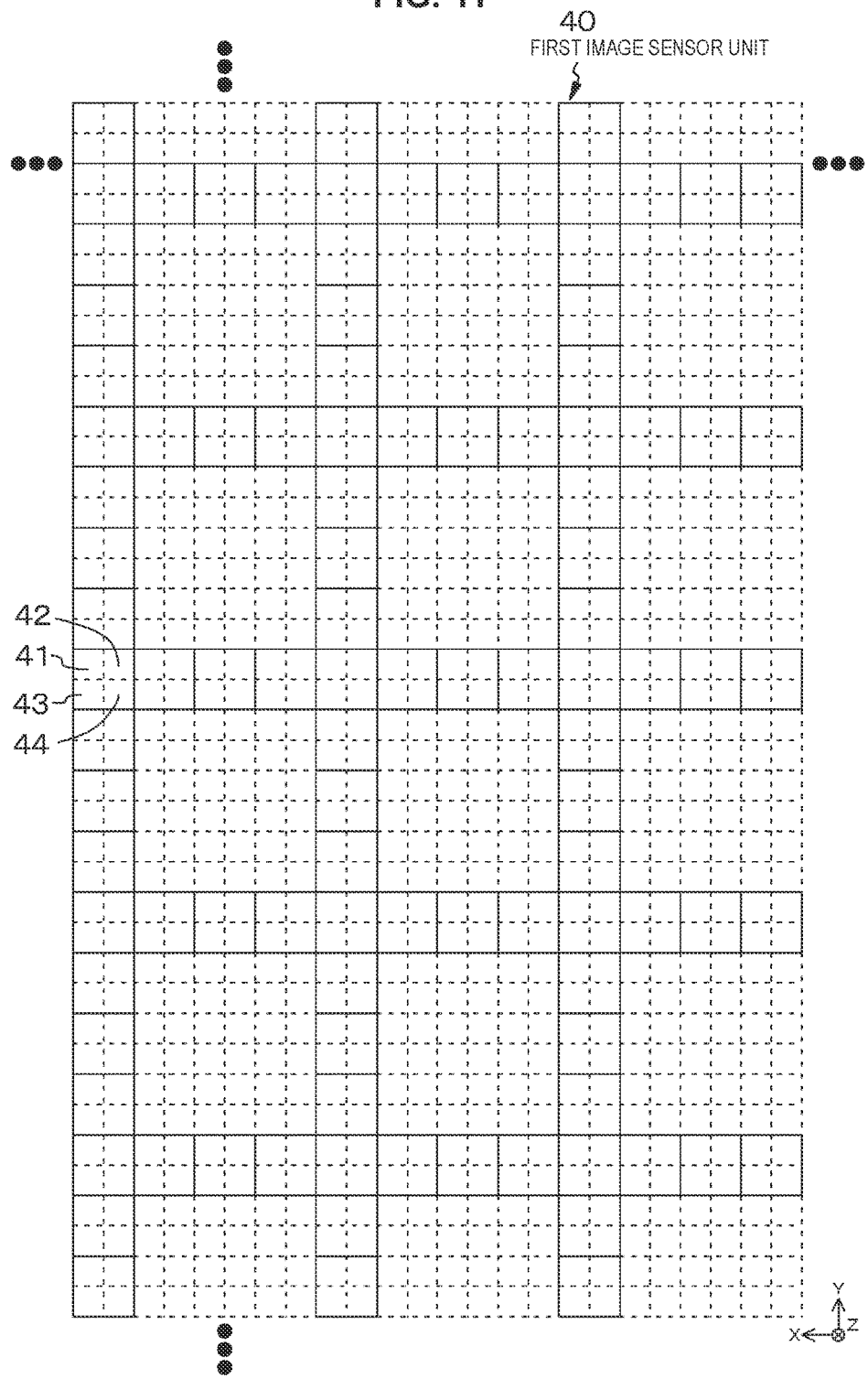
FIG. 11 is a schematic illustration highlighting how the first image sensor units are disposed in the exemplary modification of an image sensor array according to Example 1 illustrated in FIG. 10.
Figure 12:
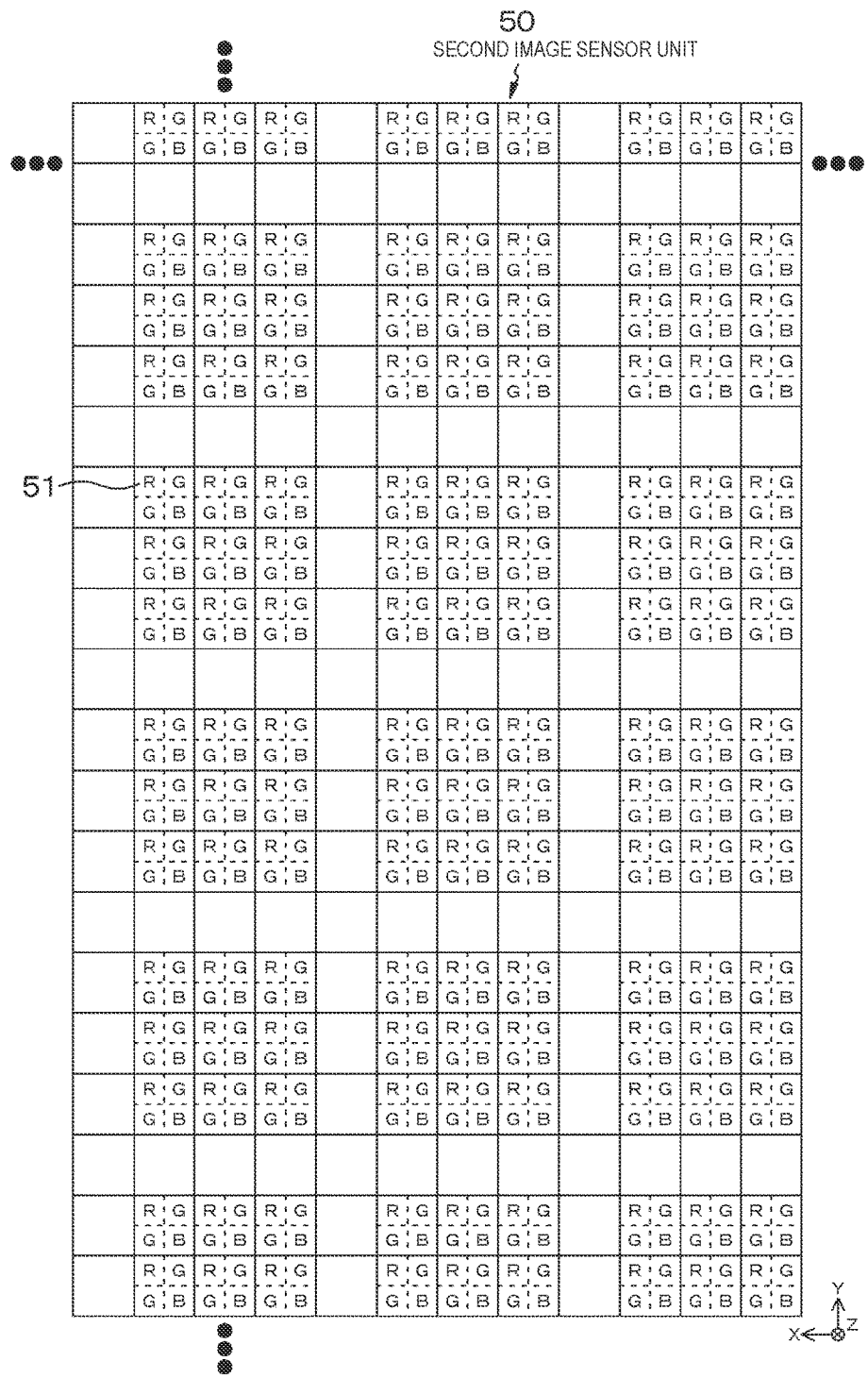
FIG. 12 is a schematic illustration highlighting how the second image sensor units are disposed in the exemplary modification of an image sensor array according to Example 1 illustrated in FIG. 10.
Figure 13:
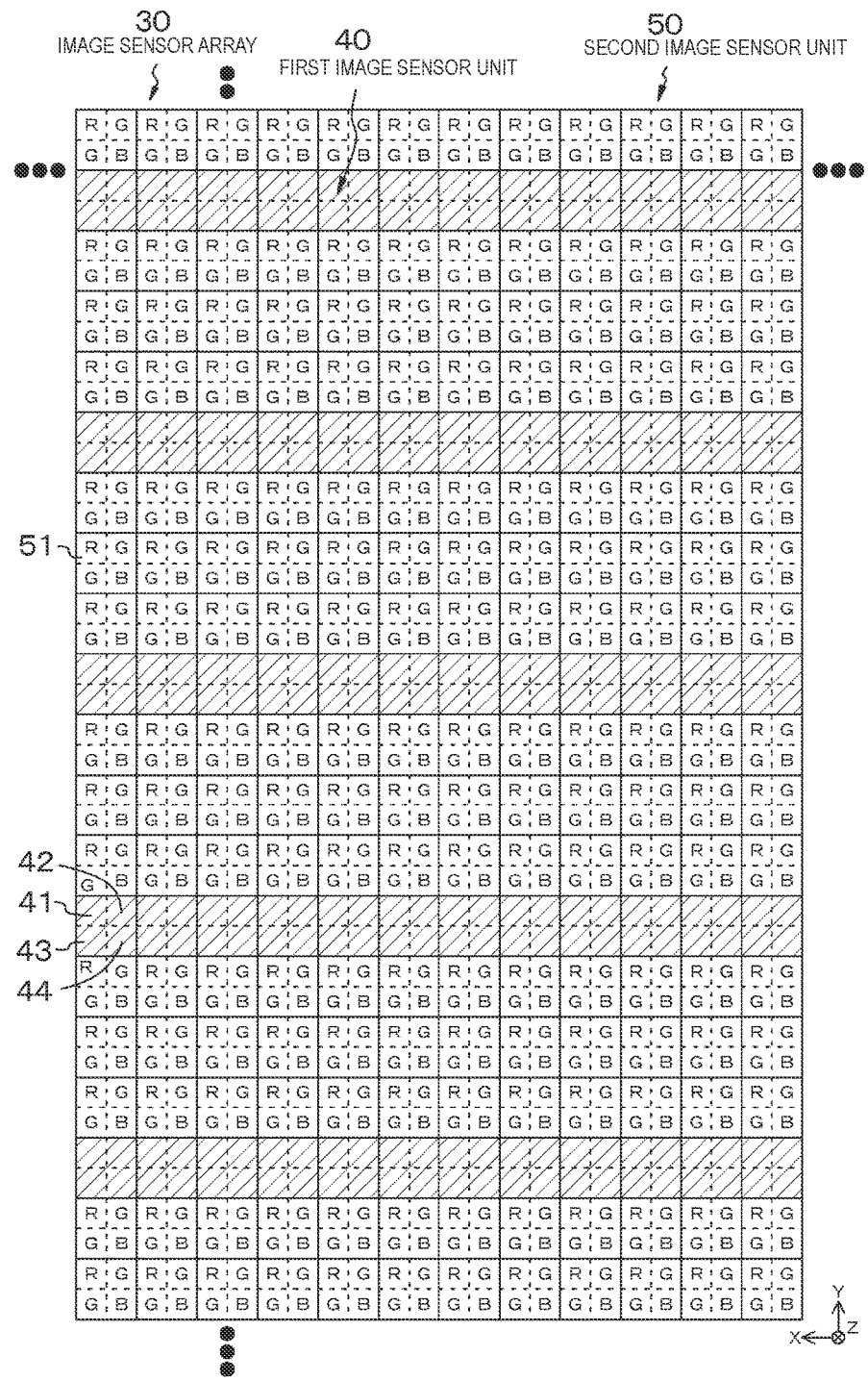
FIG. 13 schematically illustrates how first image sensor units and second image sensor units are disposed in another exemplary modification of an image sensor array according to Example 1.
Figure 14:
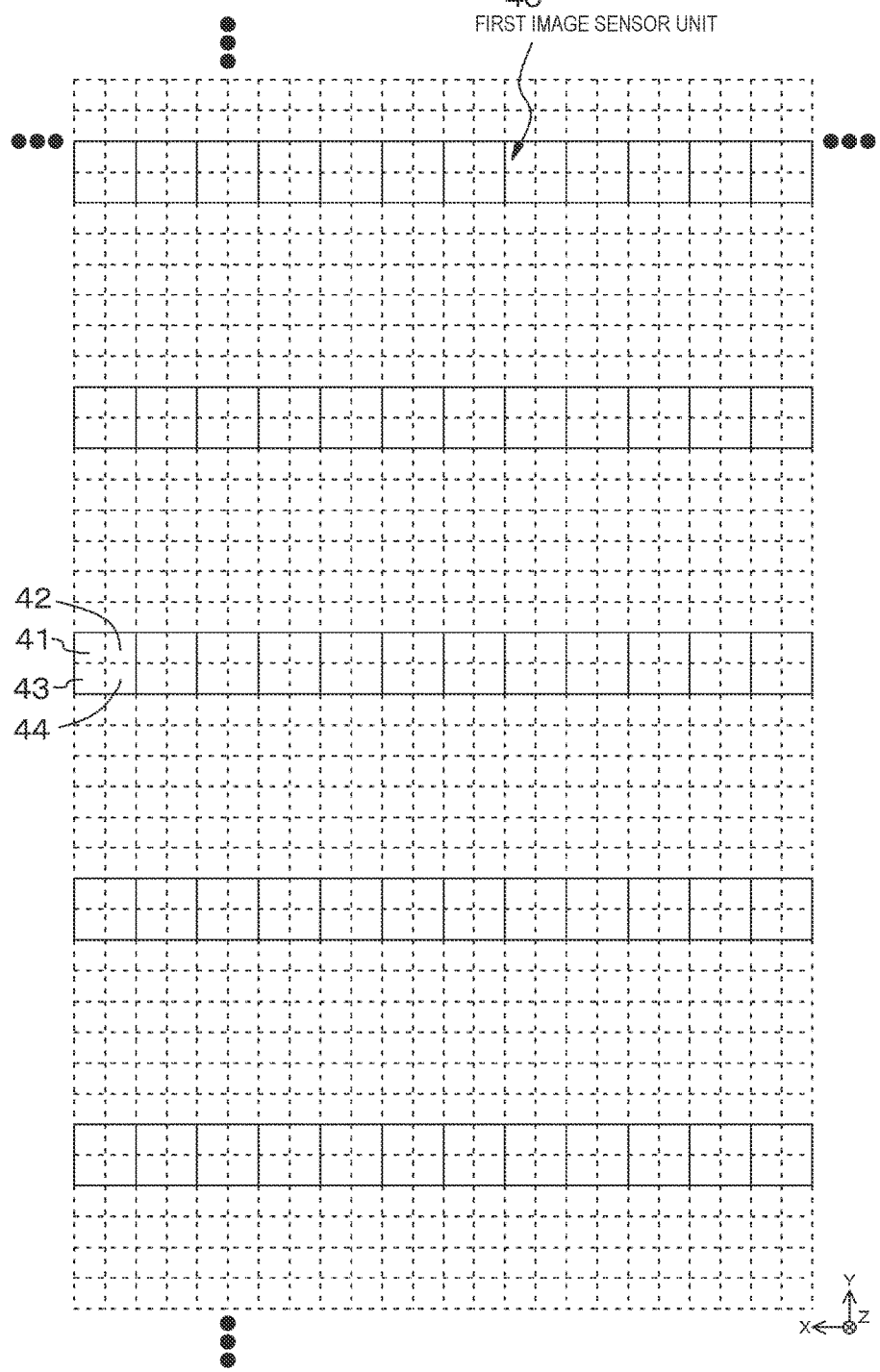
FIG. 14 is a schematic illustration highlighting how the first image sensor units are disposed in the other exemplary modification of an image sensor array according to Example 1 illustrated in FIG. 13.
Figure 15:
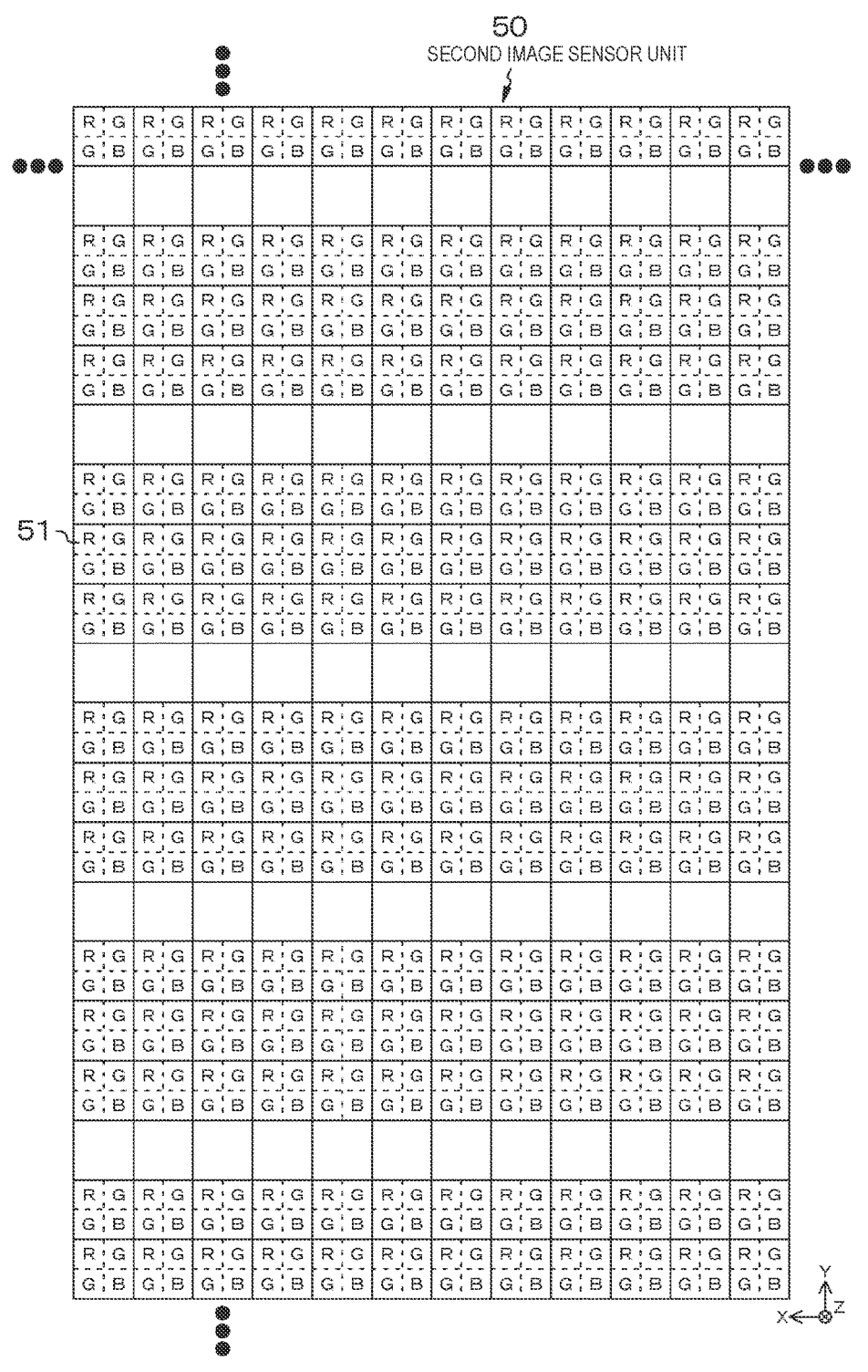

However, instead of disposing the first image sensor units 40 on the grid points of a lattice in a first direction and a second direction, lines of first image sensor units 40 may be disposed in a lattice in the first direction and the second direction, as illustrated in FIGS. 10 to 12. FIG. 10 schematically illustrates how first image sensor units and second image sensor units may be disposed in an image sensor array. FIG. 11 is a schematic illustration highlighting how the first image sensor units may be disposed in the image sensor array, while FIG. 12 is a schematic illustration highlighting how the second image sensor units may be disposed in the image sensor array. In other words, the first image sensor units 40 may be disposed along the entirety of a row extending in the first direction, with one row of first image sensor units 40 being disposed with respect to (M−1) 1-pixel units 50A along the second direction (where M=2$^m$ with m being a natural number from 1 to 5, for example; in the example illustrated in the drawings, m=2), while in addition, the first image sensor units 40 may be disposed along the entirety of a column extending in the second direction, with one column of first image sensor units 40 being disposed with respect to (N−1) 1-pixel units 50A along the first direction (where N=2$^n$ with n being a natural number from 1 to 5, for example; in the example illustrated in the drawings, n=2). Alternatively, the first image sensor units 40 may be disposed as illustrated in FIGS. 13 to 15. FIG. 13 schematically illustrates how first image sensor units and second image sensor units may be disposed in an image sensor array. FIG. 14 is a schematic illustration highlighting how the first image sensor units may be disposed in the image sensor array illustrated, while FIG. 15 is a schematic illustration highlighting how the second image sensor units may be disposed in the image sensor array. In other words, the first image sensor units 40 may be disposed along the entirety of a row extending in the first direction, with one row of first image sensor units 40 being disposed with respect to (M−1) 1-pixel units 50A along the second direction (where M=2$^m$ with m being a natural number from 1 to 5, for example; in the example illustrated in the drawings, m=2). Note that such a configuration is preferably applied to an imaging apparatus that is only rarely ever arranged vertically, such as a camcorder, for example. Examples 2 to 3 later discussed may be similarly configured. However, in such cases, the inter-unit light shielding layers 46 and 56 are also formed between the first image sensor units 40 themselves, rather than only between the first image sensor units 40 and the second image sensor units 50 and between the second image sensor unit 50 themselves.

Also, by providing the imaging apparatus with an orientation detecting apparatus such as an acceleration sensor or a gyro sensor, it can be detected whether the imaging apparatus is arranged horizontally or arranged vertically, and on the basis of the detection results, it can be determined whether to associate the first direction with the horizontal direction of the image or with the vertical direction of the image. Then, in the case where the first direction corresponds to the horizontal direction of the image, first image data may be generated from the first image sensor 41 and the third image sensor 43 while second image data is generated from the second image sensor 42 and the fourth image sensor 44, as discussed above. Meanwhile, in the case where the first direction corresponds to the vertical direction of the image, first image data may be generated from the first image sensor 41 and the second image sensor 42 while second image data is generated from the third image sensor 43 and the fourth image sensor 44, or alternatively, second image data may be generated from the first image sensor 41 and the second image sensor 42 while first image data is generated from the third image sensor 43 and the fourth image sensor 44.

Example 2

Example 2 relates to an imaging apparatus and image sensor array according to the second mode of the present disclosure. FIG. 16(A) illustrates a schematic partial cross-section of an imaging apparatus or image sensor array according to Example 2, while FIG. 16(B) schematically illustrates how image sensors and microlenses are disposed therein. FIG. 16(A) is a schematic partial cross-section view taken along the line A in FIG. 16(B). In the imaging apparatus or image sensor array according to Example 2, an inter-device light shielding layer 47 is formed only partially between the image sensor themselves which constitute the first image sensor unit 40. Note that in FIG. 16(B), image sensor boundaries are indicated by solid lines, while the inter-unit light shielding layers 46 and 56 as well as the inter-device light shielding layer 47 are shaded. The inter-device light shielding layer 47 is positioned in the boundary area of the four image sensors (the first image sensor 41, second image sensor 42, third image sensor 43, and fourth image sensor 44). In other words, the inter-device light shielding layer 47 is positioned in the central area of the first image sensor unit 40, and the planar shape of the inter-device light shielding layer 47 is square. Although not limited thereto, the length of an edge of the square herein is specifically 0.2 times the length of an edge of an image sensor constituting the first image sensor unit 40.

The graph in FIG. 2(B) illustrates simulated results of the relationship between the sensitivity of image sensors constituting a first image sensor unit and the angle of incidence for incident light in an imaging apparatus or image sensor array according to Example 2. The curve D in FIG. 2(B) illustrates the sensitivity characteristics of the second image sensor 42 and the fourth image sensor 44, while the curve E illustrates the sensitivity characteristics of the first image sensor 41 and the third image sensor 43. Note that the curves A and B illustrated in FIG. 2(A) are also illustrated in FIG. 2(B). Similarly to Example 1, FIG. 2(B) demonstrates that in the case where the value of the angle of incidence θ is negative, the sensitivity of the second image sensor 42 and the fourth image sensor 44 is high, while the sensitivity of the first image sensor 41 and the third image sensor 43 is low. Conversely, in the case where the value of the angle of incidence θ is positive, the sensitivity of the second image sensor 42 and the fourth image sensor 44 is low, while the sensitivity of the first image sensor 41 and the third image sensor 43 is high. Consequently, first image data is generated by rays with a positive angle of incidence, or in other words by the first image sensor 41 and the third image sensor 43, whereas second image data is generated by rays with a negative angle of incidence, or in other words by the second image sensor 42 and the fourth image sensor 44. In this way, by likewise disposing four image sensors 41, 42, 43, and 44 in the first image sensor unit 40 in Example 2, a depth map for obtaining two sets of image data (right-eye image data and left-eye image data) can be created on the basis of first image data and second image data from all first image sensor units 40. Electrical signals from these image sensors 41, 42, 43, and 44 are then output simultaneously or in an alternating time series, and the output electrical signals (i.e., the electrical signals output from the first image sensor units 40 and the second image sensor units 50 in the image sensor array 30) are processed by the image processor 12 and recorded to the image storage 13 as right-eye image data and left-eye image data.

FIG. 2(B) demonstrates that the value of the center angle of incidence $θ_0$ (in degrees) obtained by collimated light parallel to the first virtual plane from the spatial region above the first image sensor 41 and the third image sensor 43 passing through the first microlens 45 and reaching the second image sensor 42 and the fourth image sensor 44 in all first image sensor units 40 is $\theta_0 = 5.3°$ in the case where F=2.8, an improvement over $\theta_0 = 3.5°$ in Example 1. Also, the baseline for binocular parallax between an image obtained from the first image sensor 41 and the third image sensor 43 and an image obtained from the second image sensor 42 and the fourth image sensor 44 in all first image sensor units 40 is 6.4 mm in the case where f=35 mm and F=2.8, longer than the baseline in Example 1. In this way, by providing an inter-device light shielding layer 47, the value of the center angle of incidence $\theta_0$ is improved and the baseline for binocular parallax is lengthened over Example 1. This is due to the center angle of incidence being shifted outward relatively as a result of incident light from the pupil center being cut by the light shielding layer.

Except for the above point, the configuration and structure of the imaging apparatus or image sensor array according to Example 2 may be taken to be similar to the configuration and structure of the imaging apparatus or image sensor array described in Example 1, and for this reason detailed description thereof will be omitted.

Example 3

Example 3 relates to an imaging apparatus and image sensor array according to the third mode of the present disclosure. FIG. 17(A) illustrates a schematic partial cross-section of an imaging apparatus or image sensor array according to Example 3, while FIG. 17(B) schematically illustrates how image sensors and microlenses are disposed therein. FIG. 17(A) is a schematic partial cross-section view taken along the line A in FIG. 17(B). In the imaging apparatus or image sensor array according to Example 3, an inter-device light shielding layer 48 is formed between the image sensors themselves which constitute the first image sensor unit 40. In other words, the image sensor 41, the image sensor 42, the image sensor 43, and the image sensor 44 are partitioned from each other by the inter-device light shielding layer 48, and the inter-device light shielding layer 48 is contiguous. Note that in FIG. 17(B), image sensor boundaries are indicated by solid lines, while the inter-unit light shielding layers 46 and 56 as well as the inter-device light shielding layer 48 are shaded. Specifically, the width of the inter-device light shielding layer 48 is preferably from 0.05 to 0.02 times the length of an edge of an image sensor constituting the first image sensor unit 40, although not limited thereto, and is specifically 0.1 in Example 3. Example 6 later discussed is similar. Similarly to Example 1, in the case where the value of the angle of incidence $\theta$ is negative in Example 3, the sensitivity of the second image sensor 42 and the fourth image sensor 44 is high, while the sensitivity of the first image sensor 41 and the third image sensor 43 is low. Conversely, in the case where the value of the angle of incidence $\theta$ is positive, the sensitivity of the second image sensor 42 and the fourth image sensor 44 is low, while the sensitivity of the first image sensor 41 and the third image sensor 43 is high.

Except for the above point, the configuration and structure of the imaging apparatus or image sensor array according to Example 3 may be taken to be similar to the configuration and structure of the imaging apparatus or image sensor array described in Example 1, and for this reason detailed description thereof will be omitted. Likewise in Example 3, the imaging apparatus does not become bulky, extremely precise positioning of the first microlens is not demanded, and the problem of a large drop in resolution does not occur. Furthermore, an image sensor array can be manufactured without adding additional stages to the manufacturing process and without introducing special manufacturing processes.

Example 4

Figure 18A:
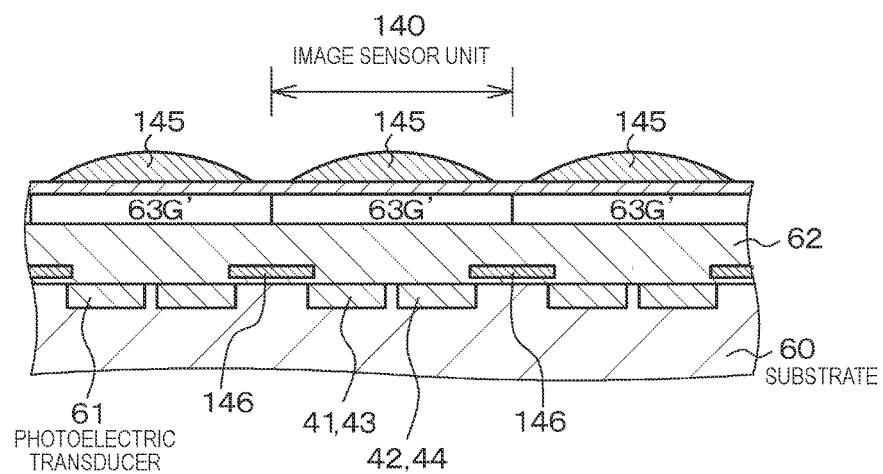
FIGS. 18(A) and 18(B) are, respectively, a schematic partial cross-section of an imaging apparatus or image sensor array according to Example 4, and a schematic illustration of how image sensors and microlenses are disposed therein.
Figure 18B:
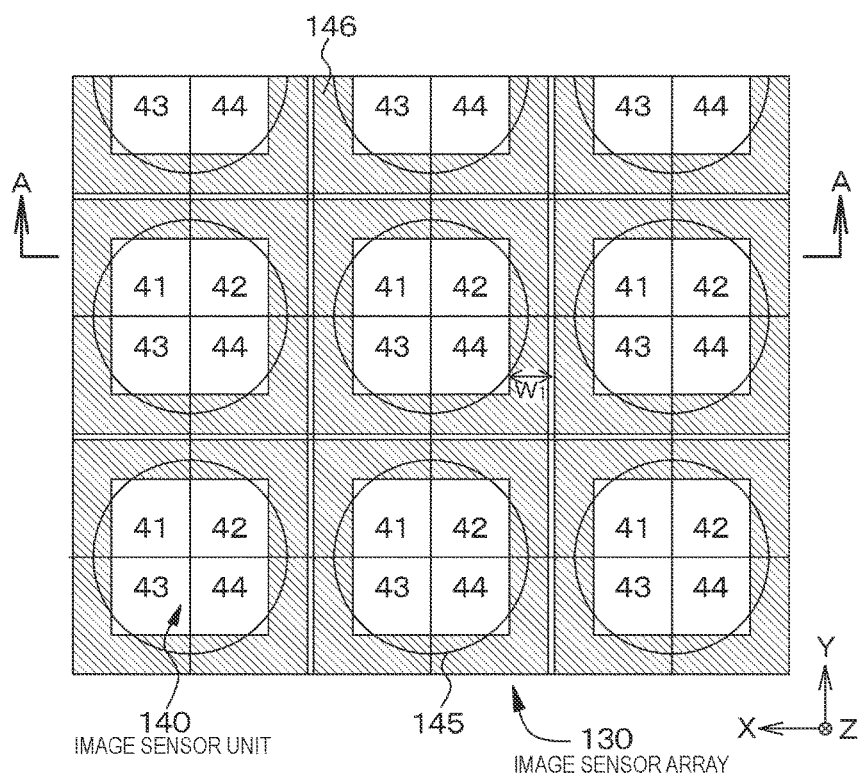

Example 4 relates to an imaging apparatus and image sensor array according to the fourth mode of the present disclosure. FIG. 18(A) illustrates a schematic partial cross-section of an imaging apparatus and image sensor array according to Example 4, while FIG. 18(B) schematically illustrates how image sensors and microlenses are disposed therein. FIG. 18(A) is a schematic partial cross-section view taken along the line A in FIG. 18(B).

An imaging apparatus 10 according to Example 4 or Examples 5 to 6 later discussed includes
(A) an imaging lens 20, and
(B) an image sensor array 130 in which multiple image sensor units 140 are arrayed,
wherein a single image sensor unit 140 includes a single microlens 145 and multiple image sensors. Also, light passing through the imaging lens 20 and reaching each image sensor unit 140 passes through the microlens 145 and forms an image on the multiple image sensors constituting the image sensor unit 140, while in addition, an inter-unit light shielding layer 146 is formed between the image sensor units 140 themselves.

Note that in FIG. 18(B) or FIG. 21(B) later discussed, the boundaries between the image sensors themselves are indicated by solid double lines with a white fill, the boundaries of each image sensor are indicated by solid lines, and the inter-unit light shielding layer 146 is shaded. The photoelectric transducers 61 are indicated by square shapes, while the microlenses 145 are indicated by circular shapes. FIGS. 19(B), 20(B), 21(B), 22(B), and 23(B) are illustrated similarly.

Also, an image sensor array according to Example 4 or Examples 5 to 6 later discussed is
an image sensor array 130 in which multiple image sensor units 140 are arrayed,
wherein a single image sensor unit 140 includes a single microlens 145 and multiple image sensors, and
an inter-unit light shielding layer 146 is formed between the image sensor units 140 themselves.

In addition, in the imaging apparatus 10 or the image sensor array 130 according to Example 4, a light shielding layer is not formed between the image sensors themselves which constitute the image sensor unit 140. Note that the value of the width $W_1$ of the inter-unit light shielding layer 146 in the image sensor unit 140 is the same value as in Example 1. The value of the width $W_1$ in Examples 5 to 7 later discussed is also the same value as in Example 1.

In Example 4 or Examples 5 to 6 later discussed, the image sensor unit 140 includes four image sensors, these being a first image sensor 41, a second image sensor 42, a third image sensor 43, and a fourth image sensor 44. Also, the first image sensor 41 and the second image sensor 42 are disposed along a first direction (X direction), the third image sensor 43 is adjacent to the first image sensor 41 along a second direction (Y direction) orthogonal to the first direction, and the fourth image sensor 44 is adjacent to the second image sensor 42 along the second direction.

The configuration and structure of the image sensors constituting the image sensor unit 140 (the first image sensor 41, second image sensor 42, third image sensor 43, and fourth image sensor 44) may be taken to be similar to that of the image sensors described in Example 1. Specifically, the image sensors 41, 42, 43, and 44 constituting the image sensor unit 140 are realized by a photoelectric transducer 61, as well as a first inter-layer insulating layer 62, a color filter 63G', a second inter-layer insulating layer 64, and a microlens 145 stacked on top of the photoelectric transducer 61. The microlens 145 covers the four image sensors 41, 42, 43, and 44.

In the imaging apparatus 10 or image sensor array 130 according to Example 4, image sensor units 140 may be disposed in a first direction and a second direction.

In Example 4, and similarly to that described in Example 1, first image data is generated by rays with a positive angle of incidence, or in other words by the first image sensor 41 and the third image sensor 43, whereas second image data is generated by rays with a negative angle of incidence, or in other words by the second image sensor 42 and the fourth image sensor 44. In this way, by likewise disposing four image sensors 41, 42, 43, and 44 in the image sensor unit 140 in Example 4, data for a stereo image can be created on the basis of first image data and second image data from all image sensor units 140. Electrical signals from these image sensors 41, 42, 43, and 44 are then output simultaneously or in an alternating time series, and the output electrical signals (i.e., the electrical signals output from the image sensor units 140 in the image sensor array 130) are processed by the image processor 12 and recorded to the image storage 13 as right-eye image data and left-eye image data. In other words, data for a stereo image (right-eye image data and left-eye image data) may be obtained on the basis of first image data obtained from the first image sensor 41 and the third image sensor 43 and second image data obtained from the second image sensor 42 and the fourth image sensor 44 in all image sensor units 140. Note that such a method itself may be an established method in the related art.

Similarly to Example 1, by providing the imaging apparatus with an orientation detecting apparatus such as an acceleration sensor or a gyro sensor, it can be detected whether the imaging apparatus is arranged horizontally or arranged vertically, and on the basis of the detection results, it can be determined whether to associate the first direction with the horizontal direction of the image or with the vertical direction of the image. Then, in the case where the first direction corresponds to the horizontal direction of the image, first image data may be generated from the first image sensor 41 and the third image sensor 43 while second image data is generated from the second image sensor 42 and the fourth image sensor 44, as discussed above. Meanwhile, in the case where the first direction corresponds to the vertical direction of the image, first image data may be generated from the first image sensor 41 and the second image sensor 42 while second image data is generated from the third image sensor 43 and the fourth image sensor 44, or alternatively, second image data may be generated from the first image sensor 41 and the second image sensor 42 while first image data is generated from the third image sensor 43 and the fourth image sensor 44.

As above, in an imaging apparatus or image sensor array according to Example 4, a single image sensor unit includes a single microlens and multiple image sensors, and image data for a stereo image can be obtained from all such image sensor units. For this reason, the imaging apparatus does not become bulky, extremely precise positioning of the microlens is not demanded, and the problem of a large drop in resolution does not occur. Furthermore, an image sensor array can be manufactured without adding additional stages to the manufacturing process and without introducing special manufacturing processes. Moreover, a compact monocular imaging apparatus having a simple configuration and structure can be provided. Additionally, since the configuration does not involve two pairs of a lens combined with a polarizing filter, imbalances and discrepancies in factors such as zoom, aperture, focus, and angle of convergence do not occur. Also, since the baseline for binocular parallax is comparatively short, natural stereo images can be obtained, while 2D images and 3D images can be easily obtained depending on how image data is processed.

Example 5

Figure 19A:
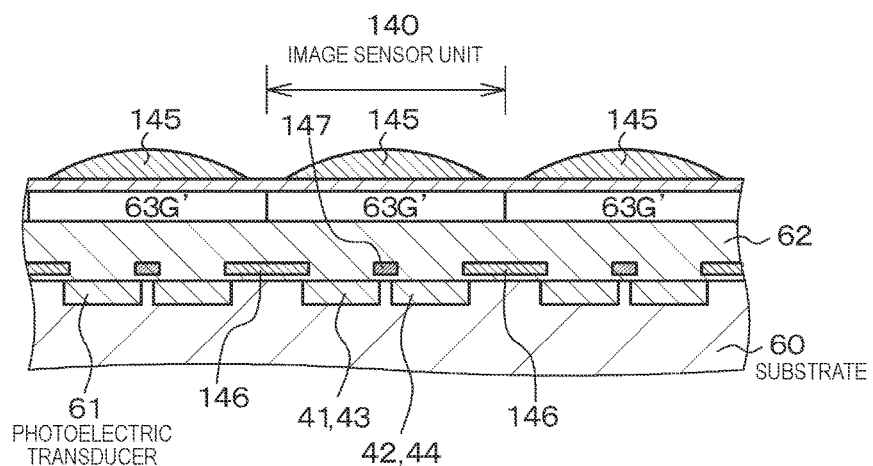
FIGS. 19(A) and 19(B) are, respectively, a schematic partial cross-section of an imaging apparatus or image sensor array according to Example 5, and a schematic illustration of how image sensors and microlenses are disposed therein.
Figure 19B:
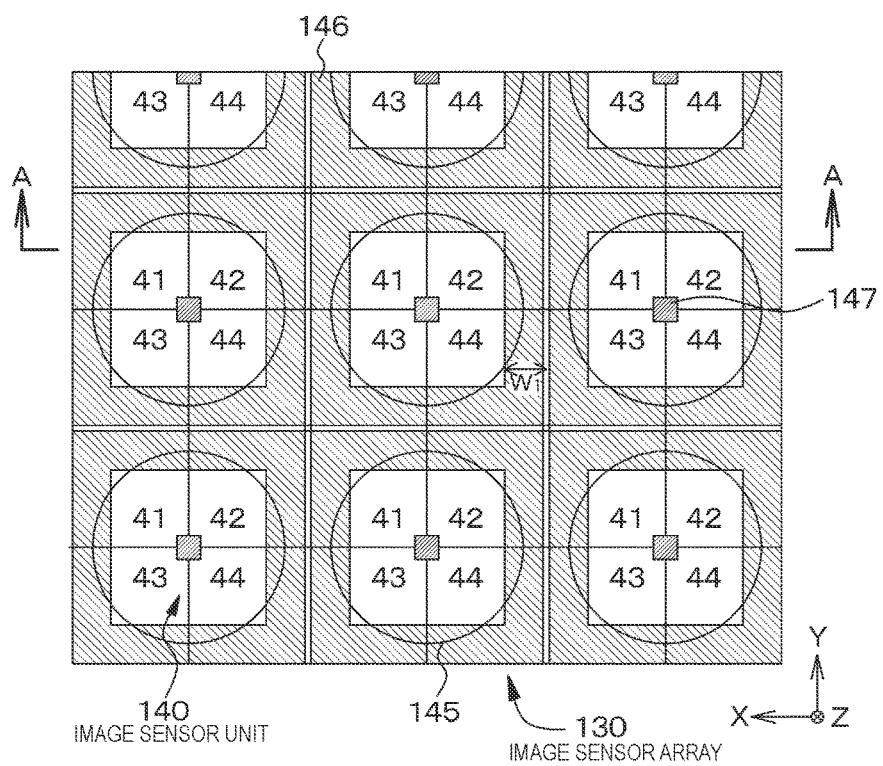

Example 5 relates to an imaging apparatus and image sensor array according to the fifth mode of the present disclosure. FIG. 19(A) illustrates a schematic partial cross-section of an imaging apparatus or image sensor array according to Example 5, while FIG. 19(B) schematically illustrates how image sensors and microlenses are disposed therein. FIG. 19(A) is a schematic partial cross-section view taken along the line A in FIG. 19(B). In the imaging apparatus or image sensor array according to Example 5, an inter-device shielding layer 147 is formed only partially between the image sensors themselves which constitute the image sensor unit 140. Note that in FIG. 19(B) or FIG. 22(B) discussed later, image sensor boundaries are indicated by solid lines, while the inter-unit light shielding layer 146 and the inter-device light shielding layer 147 are shaded. The inter-device light shielding layer 147 is positioned in the boundary area of the four image sensors (the first image sensor 41, second image sensor 42, third image sensor 43, and fourth image sensor 44). In other words, the inter-device light shielding layer 147 is positioned in the central area of the image sensor unit 140, and the planar shape of the inter-device light shielding layer 147 is square. Herein, the length of an edge of the square is taken to be similar to that of Example 2.

By likewise disposing four image sensors 41, 42, 43, and 44 in the image sensor unit 140 in Example 5, data for a stereo image can be created on the basis of first image data and second image data from all image sensor units 140. Electrical signals from these image sensors 41, 42, 43, and 44 are then output simultaneously or in an alternating time series, and the output electrical signals (i.e., the electrical signals output from the image sensor units 140 in the image sensor array 130) are processed by the image processor 12 and recorded to the image storage 13 as right-eye image data and left-eye image data.

Except for the above point, the configuration and structure of the imaging apparatus or image sensor array according to Example 5 may be taken to be similar to the configuration and structure of the imaging apparatus or image sensor array described in Example 4, and for this reason detailed description thereof will be omitted.

Example 6

Example 6 relates to an imaging apparatus and image sensor array according to the sixth mode of the present disclosure. FIG. 20(A) illustrates a schematic partial cross-section of an imaging apparatus or image sensor array according to Example 6, while FIG. 20(B) schematically illustrates how image sensors and microlenses are disposed therein. FIG. 20(A) is a schematic partial cross-section view taken along the line A in FIG. 20(B). In the imaging apparatus or image sensor array according to Example 6, an inter-device light shielding layer 148 is formed between the image sensors themselves which constitute the image sensor unit 140. In other words, the image sensor 41, the image sensor 42, the image sensor 43, and the image sensor 44 are partitioned from each other by the inter-device light shielding layer 148, and the inter-device light shielding layer 148 is contiguous. Note that in FIG. 20(B) or FIG. 23(B) discussed later, image sensor boundaries are indicated by solid lines, while the inter-unit light shielding layer 146 and the inter-device light shielding layer 148 are shaded. The width of the inter-device light shielding layer 148 is specifically taken to be similar to that of Example 3. Similarly to Example 4, in the case where the value of the angle of incidence θ is negative in Example 6, the sensitivity of the second image sensor 42 and the fourth image sensor 44 is high, while the sensitivity of the first image sensor 41 and the third image sensor 43 is low. Conversely, in the case where the value of the angle of incidence θ is positive, the sensitivity of the second image sensor 42 and the fourth image sensor 44 is low, while the sensitivity of the first image sensor 41 and the third image sensor 43 is high.

Except for the above point, the configuration and structure of the imaging apparatus or image sensor array according to Example 6 may be taken to be similar to the configuration and structure of the imaging apparatus or image sensor array described in Example 4, and for this reason detailed description thereof will be omitted. Likewise in Example 6, the imaging apparatus does not become bulky, extremely precise positioning of the first microlens is not demanded, and the problem of a large drop in resolution does not occur. Furthermore, an image sensor array can be manufactured without adding additional stages to the manufacturing process and without introducing special manufacturing processes.

Example 7

Example 7 is a modification of Examples 4 to 6. In Examples 4 to 6, the image sensor unit 140 includes four image sensors, these being a first image sensor 41, a second image sensor 42, a third image sensor 43, and a fourth image sensor 44. In other words, the image sensors 41, 42, 43, and 44 are configured as image sensors sensitive to one color of light (specifically, green light). Meanwhile, in Example 7, an image sensor unit 240 includes four image sensors, these being a first image sensor 41R, a second image sensor 42G, a third image sensor 43G, and a fourth image sensor 44B.

FIG. 21(A) illustrates a schematic partial cross-section of a modification of an imaging apparatus and image sensor array according to Example 4, while FIG. 21(B) schematically illustrates how image sensors and microlenses are disposed therein. Also, FIG. 22(A) illustrates a schematic partial cross-section of a modification of an imaging apparatus and image sensor array according to Example 5, while FIG. 22(B) schematically illustrates how image sensors and microlenses are disposed therein. Furthermore, FIG. 23(A) illustrates a schematic partial cross-section of a modification of an imaging apparatus and image sensor array according to Example 6, while FIG. 23(B) schematically illustrates how image sensors and microlenses are disposed therein. Note that FIGS. 21(A), 22(A), and 23(A) are schematic partial cross-section views taken along the line A in FIGS. 21(B), 22(B), and 23(B), respectively.

The configuration and structure of the first image sensor 41R are the same as that of the red image sensor 51R constituting a second image sensor unit 50 described in Example 1, while the configuration and structure of the second image sensor 42G and the third image sensor 43G are the same as those of the green image sensor 51G constituting a second image sensor unit 50 described in Example 1, and the configuration and structure of the fourth image sensor 44B are the same as those of the blue image sensor 51B constituting a second image sensor unit 50 described in Example 1. Specifically, the image sensors 41R, 42G, 43G, and 44B constituting the image sensor unit 240 are realized by a photoelectric transducer 61, as well as a first inter-layer insulating layer 62, a color filter 63R, 63G, or 63B, a second inter-layer insulating layer 64, and a microlens 145 stacked on top of the photoelectric transducer 61. However, unlike the image sensors 51R, 51G, and 51B in Example 1, a single microlens 145 covers the four image sensors 41R, 42G, 43G, and 44B. Also, similarly to Examples 4 to 6, the first image sensor 41R and the second image sensor 42G are disposed along a first direction (X direction), the third image sensor 43G is adjacent to the first image sensor 41R along a second direction (Y direction) orthogonal to the first direction, and the fourth image sensor 44B is adjacent to the second image sensor 42G along the second direction.

An imaging apparatus 10 according to Example 7 includes
  (A) an imaging lens 20, and
  (B) an image sensor array 230 in which multiple image sensor units 240 are arrayed,
  wherein a single image sensor unit 240 includes a single microlens 145 and multiple image sensors. Also,
  light passing through the imaging lens 20 and reaching each image sensor unit 240 passes through the microlens 145 and forms an image on the multiple image sensors constituting the image sensor unit 240.

Also, an image sensor array according to Example 7 is an image sensor array 230 in which multiple image sensor units 240 are arrayed, wherein a single image sensor unit 240 includes a single microlens 145 and multiple image sensors 41R, 42G, 43G, and 44B.

In addition, in the imaging apparatus 10 or image sensor array 230 according to Example 7, image sensor units 240 may be disposed in a first direction and a second direction.

Similarly to Example 4, an inter-unit light shielding layer 146 is formed between the image sensor units 240 themselves (see FIGS. 21(A) and 21(B)). Alternatively, similarly to Example 5, an inter-device light shielding layer 147 is formed only partially between the image sensors themselves which constitute the image sensor unit 240 (see FIGS. 22(A) and 22(B)). Alternatively, similarly to Example 6, an inter-device light shielding layer 148 is formed between the image sensors themselves which constitute the image sensor unit 240 (see FIGS. 23(A) and 23(B)).

In Example 7, and similarly to that described in Example 1, first image data is generated by rays with a positive angle of incidence, or in other words by the first image sensor 41R and the third image sensor 43G whereas second image data is generated by rays with a negative angle of incidence, or in other words by the second image sensor 42G and the fourth image sensor 44B. Specifically, red-related first image data is obtained by the first image sensor 41R, green-related first image data is obtained by the third image sensor 43G, green-related second image data is obtained by the second image sensor 42G, and blue-related second image data is obtained by the fourth image sensor 41B. Furthermore, blue-related first image data is obtained from image data obtained by the third image sensor 43G, the second image sensor 42G, and the fourth image sensor 44B. Also, red-related second image data is obtained from image data obtained by the third image sensor 43G, the second image sensor 42G, and the first image sensor 41R.

In this way, by likewise disposing four image sensors 41R, 42G, 43G, and 44B in the image sensor unit 240 in Example 7, data for a stereo image can be created on the basis of first image data and second image data from all image sensor units 240. Electrical signals from these image sensors 41R, 42G, 43G, and 44B are then output simultaneously or in an alternating time series, and the output electrical signals (i.e., the electrical signals output from the image sensor units 240 in the image sensor array 230) are processed by the image processor 12 and recorded to the image storage 13 as right-eye image data and left-eye image data. In other words, data for a stereo image (right-eye image data and left-eye image data) may be obtained on the basis of red- and green-related first image data obtained from the first image sensor 41R and the third image sensor 43G, and blue-related first image data obtained by processing image data obtained from the fourth image sensor 44B, as well as green- and blue-related second image data obtained from the second image sensor 42G and the fourth image sensor 44B, and red-related second image data obtained by processing image data obtained from the first image sensor 41R in all image sensor units 240. Such a method itself may be an established method in the related art. Note that in Example 7, the baseline for binocular parallax may be obtained on the basis of an image obtained from the third image sensor 43G and an image obtained from the second image sensor 42G.

As above, in an imaging apparatus or image sensor array according to Example 7, a single image sensor unit includes a single microlens and multiple image sensors, and image data for a stereo image can be obtained from all such image sensor units. For this reason, the imaging apparatus does not become bulky, extremely precise positioning of the microlens is not demanded, and the problem of a large drop in resolution does not occur. Furthermore, an image sensor array can be manufactured without adding additional stages to the manufacturing process and without introducing special manufacturing processes. Moreover, a compact monocular imaging apparatus having a simple configuration and structure can be provided. Additionally, since the configuration does not involve two pairs of a lens combined with a polarizing filter, imbalances and discrepancies in factors such as zoom, aperture, focus, and angle of convergence do not occur. Also, since the baseline for binocular parallax is comparatively short, natural stereo images can be obtained, while 2D images and 3D images can be easily obtained depending on how image data is processed.

The foregoing thus describes the present disclosure on the basis of preferred examples, but the present disclosure is not limited to these examples. The configuration and structure of the imaging apparatus, image sensors, image sensor arrays, and image sensor units described in the examples are for illustrative purposes, and may be modified as appropriate. The image sensors may be taken to be back-illuminated as illustrated in the drawings, but may also be taken to be front-illuminated, although not illustrated in the drawings as such.

A stereo image is displayed on the basis of right-eye image data and left-eye image data, and the technique for such display may involve a lenticular lens, a parallax barrier, or other technique in which circularly-polarized or linearly-polarized filters are applied to two projectors, the right-eye and left-eye images are respectively displayed, and an image is observed with circularly-polarized or linearly-polarized glasses corresponding to the display, for example. Note that an ordinary 2D (flat) image can be observed if an image is observed without using circularly-polarized or linearly-polarized glasses. Also, the processing sequence described in the foregoing may be interpreted as a method having a series of such operations, but may also be interpreted as a program for causing a computer to execute a series of such operations, or a recording medium storing such a program. The medium used as the recording medium may be a Compact Disc (CD), MiniDisc (MD), Digital Versatile Disc (DVD), memory card, or Blu-ray Disc (registered trademark), for example.

An imaging apparatus according to the first to sixth modes of the present disclosure may also be applied to a focusing method that controls the focusing of an imaging lens on the basis of image data based on electrical signals output from a first image sensor and a third image sensor, and image data based on electrical signals output from a second image sensor and a fourth image sensor. In other words, focus can be determined on the basis of first image data and second image data from first image sensor units. Specifically, assume that when the user of the imaging apparatus selects a subject to bring into focus on the basis of an established method, an image of that subject is formed on the image sensor array 30 or 130 in an unfocused state. In this case, the distance $2\Delta X$ on the image sensor array 30 or 130 becomes information regarding the subject's focus, or in other words the magnitude and direction of misalignment from the in-focus position, similarly to that described in FIG. 4. Consequently, the subject can be put into focus if the focusing of the imaging lens is controlled, or in other words if the focus function of the imaging lens is made to operate, such that the distance $2\Delta X$ becomes 0. Note that depending on whether the imaging apparatus is arranged horizontally or vertically, first image data may be generated on the basis of the first image sensor and the third image sensor (or the first image sensor and the second image sensor), while second image data may be generated on the basis of the second image sensor and the fourth image sensor (or the third image sensor and the fourth image sensor). However, the configuration is not limited thereto, and a two-dimensional focus determination can also be made by generating third image data on the basis of the first image sensor and the second image sensor (i.e., image data similar to the first image data) while generating fourth image data on the basis of the third image sensor and the fourth image sensor (i.e., image data similar to the second image data), rather than just generating first image data on the basis of the first image sensor and the third image sensor while generating second image data on the basis of the second image sensor and the fourth image sensor. Note that the first image data and the second image data (and additionally, the third image data and the fourth image data) may be image data obtained from all first image sensor units, but may also be image data obtained from first image sensor units positioned in the vicinity of the subject to be brought into focus.

It should be understood by those skilled in the art that various modifications, combinations, sub-combinations and alterations may occur depending on design requirements and other factors insofar as they are within the scope of the appended claims or the equivalents thereof.

Additionally, the present technology may also be configured as below.

[1] <<Imaging Apparatus: First Embodiment>>

An imaging apparatus including:
(A) an imaging lens; and
(B) an image sensor array in which a plurality of first image sensor units and a plurality of second image sensor units are arrayed,
wherein a single first image sensor unit includes a single first microlens and a plurality of image sensors,
a single second image sensor unit includes a single second microlens and a single image sensor,
light passing through the imaging lens and reaching each first image sensor unit passes through the first microlens and forms an image on the plurality of image sensors constituting the first image sensor unit,
light passing through the imaging lens and reaching each second image sensor unit passes through the second microlens and forms an image on the image sensor constituting the second image sensor unit,
an inter-unit light shielding layer is formed between the image sensor units themselves, and
a light shielding layer is not formed between the image sensor units themselves which constitute the first image sensor unit.

[2] <<Imaging Apparatus: Second Embodiment>>

An imaging apparatus including:
(A) an imaging lens; and
(B) an image sensor array in which a plurality of first image sensor units and a plurality of second image sensor units are arrayed,
wherein a single first image sensor unit includes a single first microlens and a plurality of image sensors,
a single second image sensor unit includes a single second microlens and a single image sensor,
light passing through the imaging lens and reaching each first image sensor unit passes through the first microlens and forms an image on the plurality of image sensors constituting the first image sensor unit,
light passing through the imaging lens and reaching each second image sensor unit passes through the second microlens and forms an image on the image sensor constituting the second image sensor unit,
an inter-unit light shielding layer is formed between the image sensor units themselves, and
an inter-device light shielding layer is formed only partially between the image sensors themselves which constitute the first image sensor unit.

[3] <<Imaging Apparatus: Third Embodiment>

An imaging apparatus including:
(A) an imaging lens; and
(B) an image sensor array in which a plurality of first image sensor units and a plurality of second image sensor units are arrayed,
wherein a single first image sensor unit includes a single first microlens and a plurality of image sensors,
a single second image sensor unit includes a single second microlens and a single image sensor,
light passing through the imaging lens and reaching each first image sensor unit passes through the first microlens and forms an image on the plurality of image sensors constituting the first image sensor unit,
light passing through the imaging lens and reaching each second image sensor unit passes through the second microlens and forms an image on the image sensor constituting the second image sensor unit,
an inter-unit light shielding layer is formed between the image sensor units themselves, and
an inter-device light shielding layer is formed between the image sensor units themselves which constitute the first image sensor unit.

[4] The imaging apparatus according to any one of [1] to [3], wherein
the first image sensor unit includes four image sensors, these being a first image sensor, a second image sensor, a third image sensor, and a fourth image sensor, and
the first image sensor and the second image sensor are disposed along a first direction, the third image sensor is adjacent to the first image sensor along a second direction orthogonal to the first direction, and the fourth image sensor is adjacent to the second image sensor along the second direction.

[5] The imaging apparatus according to [2], wherein
the first image sensor unit includes four image sensors, these being a first image sensor, a second image sensor, a third image sensor, and a fourth image sensor, and
the first image sensor and the second image sensor are disposed along a first direction, the third image sensor is adjacent to the first image sensor along a second direction orthogonal to the first direction, and the fourth image sensor is adjacent to the second image sensor along the second direction, and
the inter-device light shielding layer is disposed in the boundary regions of the first image sensor, the second image sensor, the third image sensor, and the fourth image sensor, and the planar shape of the inter-device light shielding layer is square.

[6] The imaging apparatus according to [4] or [5], wherein
provided that a first virtual plane is the plane extending in a first direction that includes the normal line of the first microlens passing through the center of the first microlens, the value of a center angle of incidence $\theta_0$ obtained by collimated light parallel to the first virtual plane from the spatial region above the first image sensor and the third image sensor passing through the first microlens and reaching the second image sensor and the fourth image sensor in all first image sensor units satisfies $0° \leq \theta_0 \leq 15°$.

[7] The imaging apparatus according to [4] or [5], wherein
a length of the baseline for binocular parallax between an image obtained from the first image sensor and the third image sensor versus an image obtained from the second image sensor and the fourth image sensor in all first image sensor units is computed as $4f/(3\pi F)$ (mm), where f is the focal length of the imaging lens and F is the f-number.

[8] The imaging apparatus according to any one of [1] to [7], wherein
a 1-pixel unit includes a plurality of second image sensor units, and
the surface area occupied by a single first image sensor unit is equal to the surface area occupied by a 1-pixel unit.

[9] The imaging apparatus according to [8], wherein the width of the inter-unit light shielding layer in the first image sensor unit is greater than the width of the inter-unit light shielding layer in the second image sensor unit.

[10] The imaging apparatus according to any one of [1] to [9], wherein
the first image sensor unit includes four image sensors, and
four second image sensor units constitute a 1-pixel unit.

[11] <<Image Sensor Array: First Embodiment>>

An image sensor array including:
a plurality of first image sensor units; and
a plurality of second image sensor units arrayed therein;
wherein a single first image sensor unit includes a single first microlens and a plurality of image sensors,
a single second image sensor unit includes a single second microlens and a single image sensor,
an inter-unit light shielding layer is formed between the image sensor units themselves, and
a light shielding layer is not formed between the image sensor units themselves which constitute the first image sensor unit.

[12] <<Image Sensor Array: Second Embodiment>>

An image sensor array including:
a plurality of first image sensor units; and
a plurality of second image sensor units arrayed therein;
wherein a single first image sensor unit includes a single first microlens and a plurality of image sensors,
a single second image sensor unit includes a single second microlens and a single image sensor,
an inter-unit light shielding layer is formed between the image sensor units themselves, and
an inter-device light shielding layer is formed only partially between the image sensors themselves which constitute the first image sensor unit.

[13] <<Image Sensor Array: Third Embodiment>>

An image sensor array including:
a plurality of first image sensor units; and
a plurality of second image sensor units arrayed therein;
wherein a single first image sensor unit includes a single first microlens and a plurality of image sensors,
a single second image sensor unit includes a single second microlens and a single image sensor,
an inter-unit light shielding layer is formed between the image sensor units themselves, and
an inter-device light shielding layer is formed between the image sensor units themselves which constitute the first image sensor unit.

[14] <<Image Sensor Array: Fourth Embodiment>>

An imaging apparatus including:
(A) an imaging lens; and
(B) an image sensor array in which a plurality of image sensor units are arrayed;
wherein a single image sensor unit includes a single microlens and a plurality of image sensors,
light passing through the imaging lens and reaching each image sensor unit passes through the microlens and forms an image on the plurality of image sensors constituting the image sensor unit,
an inter-unit light shielding layer is formed between the image sensor units themselves, and
a light shielding layer is not formed between the image sensor units themselves which constitute the image sensor unit.

[15] <<Image Sensor Array: Fifth Embodiment>>

An imaging apparatus including:
(A) an imaging lens; and
(B) an image sensor array in which a plurality of image sensor units are arrayed;
wherein a single image sensor unit includes a single microlens and a plurality of image sensors,
light passing through the imaging lens and reaching each image sensor unit passes through the microlens and forms an image on the plurality of image sensors constituting the image sensor unit,
an inter-unit light shielding layer is formed between the image sensor units themselves, and
an inter-device light shielding layer is formed only partially between the image sensors themselves which constitute the image sensor unit.

[16] <<Image Sensor Array: Sixth Embodiment>>

An imaging apparatus including:
(A) an imaging lens; and
(B) an image sensor array in which a plurality of image sensor units are arrayed;
wherein a single image sensor unit includes a single microlens and a plurality of image sensors,
light passing through the imaging lens and reaching each image sensor unit passes through the microlens and forms an image on the plurality of image sensors constituting the image sensor unit,
an inter-unit light shielding layer is formed between the image sensor units themselves, and
an inter-device light shielding layer is formed between the image sensor units themselves which constitute the image sensor unit.

[17] <<Image Sensor Array: Fourth Embodiment>>

An image sensor array including:
a plurality of image sensor units arrayed therein;
wherein a single image sensor unit includes a single microlens and a plurality of image sensors,
an inter-unit light shielding layer is formed between the image sensor units themselves, and
a light shielding layer is not formed between the image sensor units themselves which constitute the image sensor unit.

[18] <<Image Sensor Array: Fifth Embodiment>>

An image sensor array including:
a plurality of image sensor units arrayed therein;
wherein a single image sensor unit includes a single microlens and a plurality of image sensors,
an inter-unit light shielding layer is formed between the image sensor units themselves, and
an inter-device light shielding layer is formed only partially between the image sensors themselves which constitute the image sensor unit.

[19] <<Image Sensor Array: Sixth Embodiment>>

An image sensor array including:
  a plurality of image sensor units arrayed therein;
  wherein a single image sensor unit includes a single microlens and a plurality of image sensors,
  an inter-unit light shielding layer is formed between the image sensor units themselves, and
  an inter-device light shielding layer is formed between the image sensor units themselves which constitute the image sensor unit.

[20] <<Imaging Method: First Embodiment>>

An imaging method using an imaging apparatus in which
  (A) an imaging lens is provided, and
  (B) an image sensor array in which a plurality of first image sensor units and a plurality of second image sensor units are arrayed is provided,
  wherein a single first image sensor unit includes a single first microlens and a plurality of image sensors,
  a single second image sensor unit includes a single second microlens and a single image sensor,
  light passing through the imaging lens and reaching each first image sensor unit passes through the first microlens and forms an image on the plurality of image sensors constituting the first image sensor unit,
  light passing through the imaging lens and reaching each second image sensor unit passes through the second microlens and forms an image on the image sensor constituting the second image sensor unit,
  an inter-unit light shielding layer is formed between the image sensor units themselves, and
  a light shielding layer is not formed between the image sensor units themselves which constitute the first image sensor unit, or
  an inter-device light shielding layer is formed only partially between the image sensors themselves which constitute the first image sensor unit, or alternatively,
  an inter-device light shielding layer is formed between the image sensor units themselves which constitute the first image sensor unit,
  the first image sensor unit includes four image sensors, these being a first image sensor, a second image sensor, a third image sensor, and a fourth image sensor, and
  the first image sensor and the second image sensor are disposed along a first direction, the third image sensor is adjacent to the first image sensor along a second direction orthogonal to the first direction, and the fourth image sensor is adjacent to the second image sensor along the second direction,
  the imaging method including:
    generating electrical signals with the first image sensor and the third image sensor in order to obtain one of either a right-eye image or a left-eye image;
    generating electrical signals with the second image sensor and the fourth image sensor in order to obtain the other of either a right-eye image or a left-eye image; and
    outputting the electrical signals.

[21] <<Imaging Method: Second Embodiment>>

An imaging method using an imaging apparatus in which
  (A) an imaging lens is provided, and
  (B) an image sensor array in which a plurality of image sensor units are arrayed is provided,
  wherein a single image sensor unit includes a single first microlens and a plurality of image sensors,
  light passing through the imaging lens and reaching each image sensor unit passes through the microlens and forms an image on the plurality of image sensors constituting the image sensor unit,
  an inter-unit light shielding layer is formed between the image sensor units themselves, and
  a light shielding layer is not formed between the image sensor units themselves which constitute the image sensor unit, or
  an inter-device light shielding layer is formed only partially between the image sensors themselves which constitute the image sensor unit, or alternatively,
  an inter-device light shielding layer is formed between the image sensor units themselves which constitute the image sensor unit,
  the image sensor unit includes four image sensors, these being a first image sensor, a second image sensor, a third image sensor, and a fourth image sensor, and
  the first image sensor and the second image sensor are disposed along a first direction, the third image sensor is adjacent to the first image sensor along a second direction orthogonal to the first direction, and the fourth image sensor is adjacent to the second image sensor along the second direction,
  the imaging method including:
    generating electrical signals with the first image sensor and the third image sensor in order to obtain one of either a right-eye image or a left-eye image;
    generating electrical signals with the second image sensor and the fourth image sensor in order to obtain the other of either a right-eye image or a left-eye image; and
    outputting the electrical signals.

[22] The imaging method according to [20] or [21], wherein image data for obtaining a right-eye image and image data for obtaining a left-eye image is obtained on the basis of a depth map created on the basis of electrical signals from the first image sensor and the third image sensor as well as electrical signals from the second image sensor and the fourth image sensor, and electrical signals output from image sensors constituting second image sensor units.

[23] <<Focusing Method: First Embodiment>>

A focusing method using an imaging apparatus in which
  (A) an imaging lens is provided, and
  (B) an image sensor array in which a plurality of first image sensor units and a plurality of second image sensor units are arrayed is provided,
  wherein a single first image sensor unit includes a single first microlens and a plurality of image sensors,
  a single second image sensor unit includes a single second microlens and a single image sensor,
  light passing through the imaging lens and reaching each first image sensor unit passes through the first microlens and forms an image on the plurality of image sensors constituting the first image sensor unit,
  light passing through the imaging lens and reaching each second image sensor unit passes through the second microlens and forms an image on the image sensor constituting the second image sensor unit,
  an inter-unit light shielding layer is formed between the image sensor units themselves, and
  a light shielding layer is not formed between the image sensor units themselves which constitute the first image sensor unit, an inter-device light shielding layer is formed only partially between the image sensors themselves which constitute the first image sensor unit, or alternatively, an inter-device light shielding layer is formed between the image sensor units themselves which constitute the first image sensor unit, the first image sensor unit includes four image sensors, these being a first image sensor, a second image sensor, a third image sensor, and a fourth image sensor, and the first image sensor and the second image sensor are disposed along a first direction, the third image sensor is adjacent to the first image sensor along a second direction orthogonal to the first direction, and the fourth image sensor is adjacent to the second image sensor along the second direction, the focusing method including:

controlling the focusing of an imaging lens on the basis of image data based on electrical signals output from the first image sensor and the third image sensor, and image data based on electrical signals output from the second image sensor and the fourth image sensor.

[24] <<Focusing Method: Second Embodiment>>

A focusing method using an imaging apparatus in which
(A) an imaging lens is provided, and
(B) an image sensor array in which a plurality of image sensor units are arrayed is provided,
wherein a single image sensor unit includes a single first microlens and a plurality of image sensors,
light passing through the imaging lens and reaching each image sensor unit passes through the microlens and forms an image on the plurality of image sensors constituting the image sensor unit,
an inter-unit light shielding layer is formed between the image sensor units themselves, and
a light shielding layer is not formed between the image sensor units themselves which constitute the image sensor unit, or
an inter-device light shielding layer is formed only partially between the image sensors themselves which constitute the image sensor unit, or alternatively,
an inter-device light shielding layer is formed between the image sensor units themselves which constitute the image sensor unit,
the image sensor unit includes four image sensors, these being a first image sensor, a second image sensor, a third image sensor, and a fourth image sensor, and the first image sensor and the second image sensor are disposed along a first direction, the third image sensor is adjacent to the first image sensor along a second direction orthogonal to the first direction, and the fourth image sensor is adjacent to the second image sensor along the second direction,
the focusing method including:
controlling the focusing of an imaging lens on the basis of image data based on electrical signals output from the first image sensor and the third image sensor, and image data based on electrical signals output from the second image sensor and the fourth image sensor.

What is claimed is:

1. An imaging sensor array, comprising first pixel units, second pixel units, and an inter-unit light shielding layer between each first unit and adjacent second pixel units wherein:
the first pixel units and second pixel united are arrayed along rows and columns,
each first pixel unit includes only one first microlens, a first color filter, and a plurality of first photoelectric transducers, the first microlens overlapping all of the first photoelectric transducers,
each second pixel unit includes a second microlens, a second color filter, and only one second photoelectric transducer,
in a plan view, each first pixel unit has a footprint that is larger than a footprint of each second pixel unit, and
a distance between centers of adjacent second photoelectric transducers along a row or a column is shorter than a distance between centers of a first photoelectric transducer and a second photoelectric transducer which are adjacent to each other along the row or the column.

2. The imaging sensor array of claim 1, wherein the centers of the first photoelectric transducers are not aligned along a row or column with the centers of the second photoelectric transducers.

3. The imaging sensor array of claim 1, wherein a plurality of first pixel units are interspersed among the second pixel units.

4. The imaging sensor array of claim 1, wherein a plurality of first pixel units are adjacent to each other.

5. The imaging sensor array of claim 2, wherein a first plurality of first pixel units are adjacent along a row or column.

6. The imaging sensor array of claim 5, wherein the first plurality of pixels units are adjacent along a column and a second plurality of first pixel units are adjacent along a row.

7. The imaging sensor array of claim 1, further comprising, for each first pixel unit, a second inter-unit shielding layer between the first photoelectric transducers of the first pixel unit.

8. The imaging sensor array of claim 1, further comprising, for each first pixel unit, a second inter-unit shielding layer only partially between the first photoelectric transducers of the first pixel units.

9. The imaging sensor array of claim 1, wherein:
each first pixel unit comprises four first photoelectric transducers arranged in a 2×2 array, and
for each first pixel unit, a second inter-unit shielding layer between the first photoelectric transducers of the first pixel unit.

10. The imaging sensor array of claim 1, wherein:
each first pixel unit comprises four first photoelectric transducers arranged in a 2×2 array, and
for each first pixel unit, a second inter-unit shielding layer only partially between the first photoelectric transducers of the first pixel unit at a position where four corners of the first photoelectric transducers meet.

11. The imaging sensor array of claim 1, wherein each second photoelectric transducer is surrounded by another inter-device shielding layer, thereby separating the second photoelectric transducer from adjacent second photoelectric transducers by the another inter-device shielding layer.

12. The imaging sensor array of claim 1, wherein, for each first pixel unit, where a shortest distance between the first photoelectric transducers and an outer periphery of the first pixel unit is W1, and where a shortest distance between the each second photoelectric transducers and an outer periphery of the second pixel unit is W2, W1 is greater than W2.

13. The imaging sensor array of claim 1, wherein:
each first pixel unit includes four first photoelectric transducers, these being a first image sensor, a second image sensor, a third image sensor, and a fourth image sensor,
the first image sensor and the second image sensor are disposed along a first direction, the third image sensor is adjacent to the first image sensor along a second direction orthogonal to the first direction, and the fourth image sensor is adjacent to the second image sensor along the second direction.

14. The imaging sensor array of claim 13, wherein, for each first pixel unit, provided that a first virtual plane is a plane extending in a first direction that includes an optical axis of the first microlens passing through a center of the first microlens, the value of a center angle of incidence $\theta_0$ obtained by collimated light parallel to the first virtual plane from a spatial region above the first image sensor and the third image sensor passing through the first microlens and reaching the second image sensor and the fourth image sensor in all first image sensor units satisfies $0° \leq \theta_0 \leq 15°$.

15. The imaging sensor array according to claim 13, wherein a length of a baseline for binocular parallax between an image obtained from the first image sensor and the third image sensor versus an image obtained from the second image sensor and the fourth image sensor in all first image sensor units is computed as $4f/(37\pi F)$ (mm), where f is a focal length of the imaging lens and F is the f-number.

* * * * *